United States Patent
Inaba et al.

[11] Patent Number: 6,153,476
[45] Date of Patent: Nov. 28, 2000

[54] SEMICONDUCTOR DEVICE AND METHOD FOR MANUFACTURING THE SAME

[75] Inventors: Satoshi Inaba, Yokohama; Tohru Ozaki, Tokyo; Yusuke Kohyama, Yokosuka; Kazumasa Sunouchi, Yokohama, all of Japan

[73] Assignee: Kabushiki Kaisha Toshiba, Kawasaki, Japan

[21] Appl. No.: 09/030,127

[22] Filed: Feb. 25, 1998

[30] Foreign Application Priority Data

Feb. 27, 1997 [JP] Japan ................................. 9-044244

[51] Int. Cl.$^7$ ..................... H01L 21/8234; H01L 21/336
[52] U.S. Cl. ...................... 438/275; 438/241; 438/258; 438/279
[58] Field of Search ........................... 438/275, 258, 438/241, 303, 305, 595, 642, 279

[56] References Cited

U.S. PATENT DOCUMENTS

| | | | |
|---|---|---|---|
| 4,753,897 | 6/1988 | Lund et al. | 438/533 |
| 5,329,482 | 7/1994 | Nakajima et al. | 438/275 |
| 5,468,983 | 11/1995 | Hirase et al. | 257/344 |
| 5,668,052 | 9/1997 | Matsumoto et al. | 438/624 |
| 5,698,902 | 12/1997 | Uehara et al. | 257/412 |
| 5,728,595 | 3/1998 | Fukase et al. | 438/241 |
| 5,759,889 | 6/1998 | Sakao | 438/241 |
| 5,763,312 | 6/1998 | Jeng et al. | 438/303 |
| 5,856,219 | 1/1999 | Naito et al. | 438/275 |

FOREIGN PATENT DOCUMENTS

| | | |
|---|---|---|
| 4219969 | 8/1992 | Japan. |
| 590537 | 4/1993 | Japan. |
| 6177349 | 6/1994 | Japan. |
| 7176729 | 7/1995 | Japan. |

*Primary Examiner*—Michael Trinh
*Attorney, Agent, or Firm*—Banner & Witcoff, Ltd.

[57] ABSTRACT

In a DRAM, a plurality of first MOSFETs are formed in a cell region on a semiconductor substrate based on the minimum design rule, and a first gate side-wall having a side-wall insulation film is formed on the side-wall portion of a first gate electrode of each of the first MOSFETs. At least one second MOSFET is formed in a peripheral circuit region on the semiconductor substrate, and a second gate side-wall having side-wall insulation films is formed on the side-wall portion of a second gate electrode of the second MOSFET. Both the first MOSFETs, which is capable of forming a fine contact hole self-aligned with the first gate electrode, and the second MOSFET, which is capable of sufficiently mitigating the parasitic resistance while suppressing the short channel effect, can be formed on the same substrate.

29 Claims, 12 Drawing Sheets

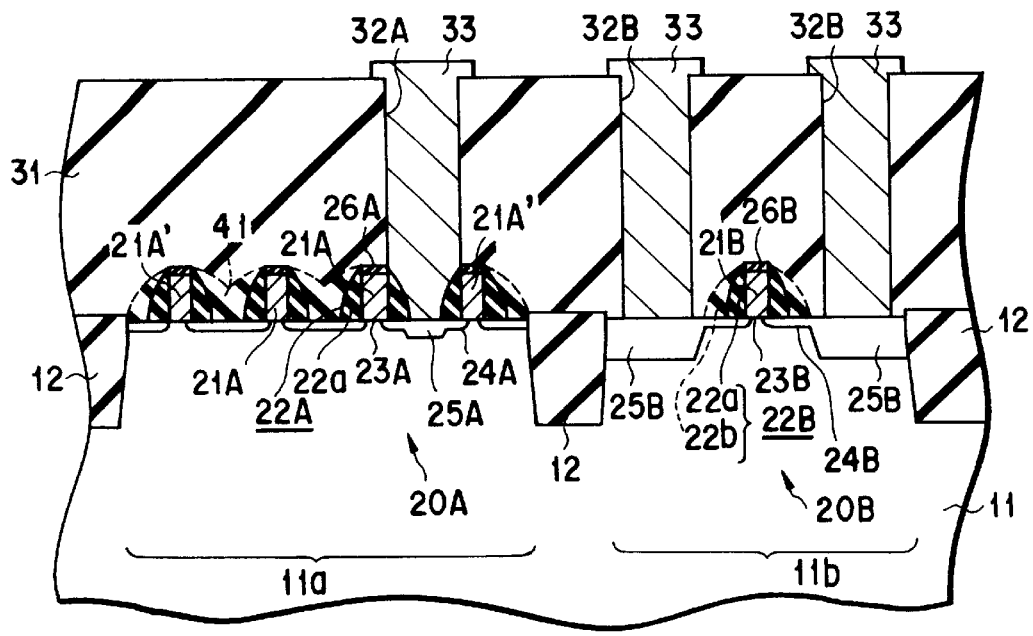
F I G. 1
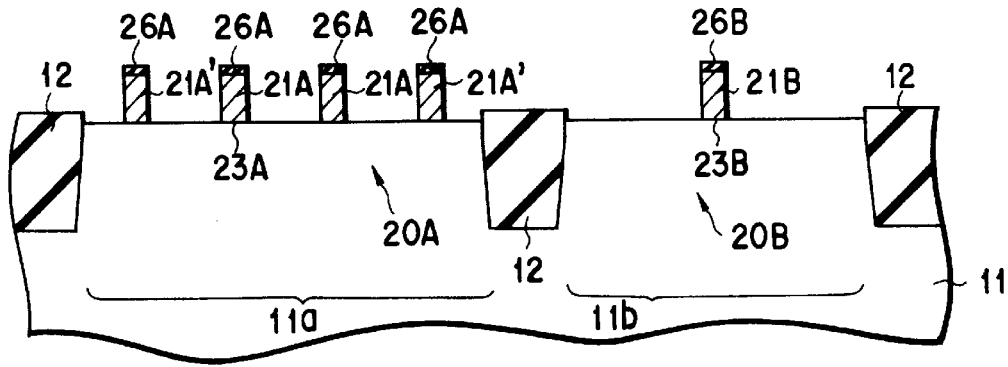
F I G. 2A
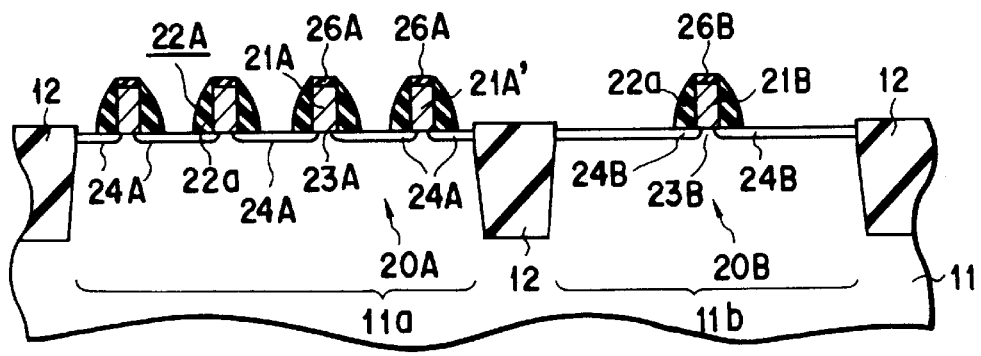
F I G. 2B

SEMICONDUCTOR DEVICE AND METHOD FOR MANUFACTURING THE SAME

BACKGROUND OF THE INVENTION

The present invention relates to a semiconductor device including at least first and second insulated gate transistors integrated on a single substrate and a method for manufacturing the same and, more specifically, to a semiconductor device with a MIS structure such as a DRAM (dynamic random access memory) including both a memory cell section and its peripheral circuit section mounted on one chip and a method for manufacturing the same.

To miniaturize and highly integrate a plurality of insulated gate transistors on a semiconductor substrate is generally useful for achieving high performance of an LSI since the area of devices occupied on the substrate is decreased, the current driving power of the devices is increased, the parasitic capacitance thereof is reduced, and so on. A trial product of a CMOS whose gate length is typically 0.1 $\mu$m or less has been already successful at research level, and its high performance has been indeed confirmed.

A serious hindrance to the miniaturization is a short-channel effect in which the absolute value of a threshold voltage drops as the gate length decreases. To prevent this, a so-called scaling rule is proposed, and a transistor is decreased in size according thereto, with the result that the impurity concentration of the substrate has to be increased, or the thickness of an insulation film has to be decreased and so has to be the junction depth of a source/drain region (impurity diffusion layer). In particular, the decrease in the junction depth becomes more important as a solution for suppressing the short-channel effect.

On the other hand, the depth of the impurity diffusion layer need to be great to some extent at a point away from a channel in order to mitigate the parasitic resistance of the insulated gate transistor using the salicide technique. In other words, if silicide is formed on the source/drain region, the junction leakage current between the impurity diffusion layer and substrate becomes large. This large leakage current is prevented by forming an impurity diffusion layer having a considerable depth.

A source/drain extension structure is proposed with a view to suppressing the short-channel effect. In this structure, ion implantation for forming a shallow junction is performed to form a so-called extension region of source/drain. A side-wall (gate side-wall) is formed on the side-wall portion of a gate electrode and then ion implantation is carried out to form an impurity diffusion layer having a sufficiently deep junction except where the gate side-wall is formed. That is, the impurity diffusion layer is formed at a position away from the end portion of the extension region having a shallow junction, by the length of the gate side-wall.

A gate side-wall forming process is employed for obtaining the extension structure. Conventionally, the same gate side-wall length is used for all transistors constituting an LSI. Therefore, particularly in a DRAM including a memory cell section and its peripheral circuit section on one chip, the gate side-wall lengths of a transistor with a small channel width used in the memory section and a transistor with a large channel width used in the peripheral circuit section are not matching each other. This is due to the fact that the design rule of the transistor of the peripheral circuit section is close to an isolation pattern, whereas the memory cell section employs a pattern reduced to the limitation of the lithography technique.

For example, an SAC (self-aligned contact) technique using an etching rate difference of a silicon nitride film to a silicon oxide film provided on the gate side-wall, is generally used when a contact hole is formed in the source/drain region of the memory cell section. If, however, the gate side-wall length is not scaled down in accordance with the design rule (scaling rule), no gate side-wall can be formed in the memory cell section. It is therefore difficult to form a contact hole using the SAC technique and thus impossible to form a memory cell section.

As described above, it is necessary to reduce the gate side-wall length according to the scaling rule in the transistor of the memory cell section. On the other hand, when the gate side-wall length is scaled down, an inconvenience occurs in the transistor of the peripheral circuit section.

As has been described, in particular, when silicide is formed on the impurity diffusion layer of the transistor, the junction depth of the impurity diffusion layer has to be sufficiently large in order to decrease the junction leakage current due to the formation of the silicide. If the gate side-wall length is small, impurities are greatly diffused in the horizontal (lateral) direction under the gate side-wall, which seriously influence on the short-channel effect. Therefore, in order to improve the current drive while suppressing the short-channel effect in the transistor of the peripheral circuit section, the gate side-wall length is greatly increased and the resistance of the impurity diffusion layer has to be considerably small.

BRIEF SUMMARY OF THE INVENTION

As described above, the conventional semiconductor device has a drawback wherein the requirements of both a transistor whose gate side-wall need to be reduced in length according to the scaling rule and a transistor whose gate side-wall need to be increased in length considerably and whose impurity diffusion layer need to be decreased in resistance sufficiently, cannot be satisfied at the same time.

It is accordingly an object of the present invention to provide a semiconductor device capable of improving in packed density and performance by integrating, on the same substrate, both a first insulated gate transistor which allows a fine contact hole to be formed so as to be self-aligned with a gate electrode and a second insulated gate transistor which sufficiently mitigates the parasitic resistance while suppressing the short-channel effect.

To attain the above object, according to a first aspect of the present invention, there is provided a semiconductor device of a MIS structure including at least first and second transistors integrated on a semiconductor substrate, wherein a side-wall length of a second side-wall insulation film formed on a side-wall portion of a second gate electrode of the second transistor is greater than a side-wall length of a first side-wall insulation film formed on a side-wall portion of a first gate electrode of the first transistor.

According to a second aspect of the present invention, there is provided a semiconductor device comprising:

a semiconductor substrate divided into a memory cell region and a peripheral circuit region by a field region;

a plurality of first transistors integrated in the memory cell region of the semiconductor substrate and having first gate electrodes, a first side-wall insulation film being formed on a side-wall portion of each of the first gate electrodes by a first insulator; and at least one second transistor provided in the peripheral circuit region of the semiconductor substrate and having a second gate electrode, a second side-wall insulation film being formed on a side-wall portion of the second gate electrode by both the first insulator and a second insulator.

According to a third aspect of the present invention, there is provided a semiconductor device comprising:

a semiconductor substrate divided into a memory cell region and a peripheral circuit region by a field region;

a plurality of first transistors integrated in the memory cell region of the semiconductor substrate and having first gate electrodes, a first side-wall insulation film being formed on a side-wall portion of each of the first gate electrodes by a first insulator;

at least one second transistor provided in the peripheral circuit region of the semiconductor substrate and having a second gate electrode, a second side-wall insulation film being formed on a side-wall portion of the second gate electrode by both the first insulator and a second insulator; and a third insulator provided between the first insulator and the second insulator so as to cover a surface of the semiconductor substrate.

According to a fourth aspect of the present invention, there is provided a semiconductor device comprising:

a plurality of first transistors formed in a memory cell region on a semiconductor substrate and including first gate electrodes each of which is provided with a first side-wall insulation film formed of a first insulator having a length of approximately d, a maximum space between the first gate electrodes being smaller than $2(d+x)$; and a plurality of second transistors formed in a peripheral circuit region on the semiconductor substrate and including both second gate electrodes each of which is provided with a second side-wall insulation film formed of at least the first insulator having a length of approximately d and low-resistance regions each provided on a surface of a diffusion region located away from the first insulator by a distance of approximately x, a maximum space between the second gate electrodes being larger than $2(d+x)$.

According to a fifth aspect of the present invention, there is provided a method of manufacturing a semiconductor device, comprising the steps of:

forming first gate electrodes of a plurality of first transistors, which constitute a memory cell section, in a memory cell region on a semiconductor substrate and forming a second gate electrode of at least one second transistor, which constitutes a peripheral circuit section, in a peripheral circuit region on the semiconductor substrate;

forming a first side-wall insulation film of a first insulator on a side-wall portion of each of the first gate electrodes; and forming a second side-wall insulation film on a side-wall portion of the second gate electrode by both the first insulator and a second insulator.

According to a sixth aspect of the present invention, there is provided a method of manufacturing a semiconductor device, comprising the steps of:

forming a field region by which an element region is divided into a memory cell region and a peripheral circuit region;

forming first gate electrodes of a plurality of first transistors, which constitute a memory cell section, in the memory cell region, and forming a second gate electrode of at least one second transistor, which constitutes a peripheral circuit section, in the peripheral circuit region;

depositing a first insulative material above an entire surface of the semiconductor substrate;

selectively removing the first insulative material to form both a first side-wall insulation film of a first insulator on a side-wall portion of each of the first gate electrodes and the first insulator on a side-wall portion of the second gate electrode;

depositing a second insulative material above the entire surface of the semiconductor substrate; and selectively removing the second insulative material to form a second side-wall insulation film of the first insulator and a second insulator on a side-wall portion of the second gate electrode.

According to a seventh embodiment of the present invention, there is provided a method of manufacturing a semiconductor device, comprising the steps of:

forming first gate electrodes of a plurality of first transistors, which constitute a memory cell section, in a memory cell region on a semiconductor substrate and forming a second gate electrode of at least one second transistor, which constitutes a peripheral circuit section, in a peripheral circuit region on the semiconductor substrate;

depositing a first insulative material above an entire surface of the semiconductor substrate;

selectively removing the first insulative material to form a first insulator on each of side-portions of the first gate electrodes and the second gate electrode;

depositing a second insulative material above the entire surface of the semiconductor substrate; and selectively removing the second insulative material to leave the second insulative material between the first gate electrodes.

In the semiconductor device according to the present invention and the method for manufacturing the same, the side-wall insulation film of the gate electrode in the second insulated gate transistor can be increased considerably, while that of the gate electrode in the first insulated gate transistor is scaled down in accordance with the scaling rule. It is thus possible to simultaneously satisfy the requirements of both a transistor which necessitates reducing the length of the side-wall insulation film in accordance with the scaling rule and another transistor which necessitates sufficiently increasing the length of the side-wall insulation film and considerably decreasing the resistance of the impurity diffusion layer.

According to the present invention, if a space between the gate electrodes of the first and second insulated gate transistors is defined, a patterned low-resistance region can be formed selectively on the surface of the diffusion layer but not through the lithographic process.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 1 is a cross-sectional view illustrating the major part of a DRAM as a semiconductor device according to a first embodiment of the present invention;

FIGS. 2A to 2E are cross-sectional views illustrating the major part of the DRAM in order to describe a process of manufacturing the same;

DETAILED DESCRIPTION OF THE INVENTION

Figure 2C:
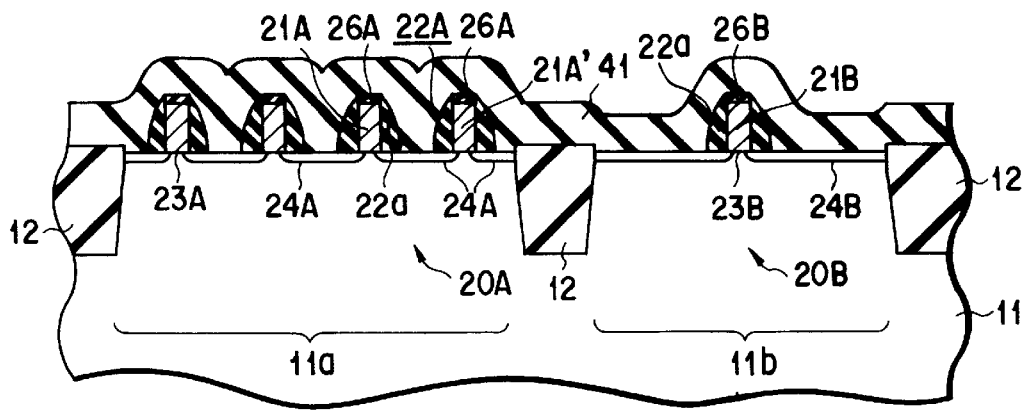

Embodiments of the present invention will now be described with reference to the accompanying drawings.
(First Embodiment)

FIG. 1 is a cross-sectional view illustrating the major part of a DRAM as a semiconductor device according to a first embodiment of the present invention. The DRAM including a memory cell section and its peripheral circuit section mounted on the same chip.

The DRAM has a MIS structure in which first and second insulated gate transistors (hereinafter referred to as MOSFETs) 20A and 20B are integrated on a semiconductor substrate 11. A gate side-wall (second side-wall insulation film) 22B formed on the side-wall portion of a gate electrode 21B in the MOSFET 20B is longer than a gate side-wall (first side-wall insulation film) 22A formed on the side-wall portion of a gate electrode 21A in the MOSFET 20A.

An element isolation region (field region) 12 is selectively formed on the surface of the substrate 11 to isolate a memory cell section forming region (cell region) 11a and a peripheral circuit section forming region (peripheral circuit region) 11b from each other. For example, the cell region 11a includes a plurality of MOSFETs 20A. Each of the MOSFETs 20A has a gate electrode 21A provided on the substrate 11 with a gate insulation film 23A interposed therebetween. An extension region 24A of a shallow junction, which serves as a source/drain region, is provided in the surface area of the substrate 11 and between adjacent gate electrodes 21A. An impurity diffusion region 25A of a deep junction is partly formed in each of some or all of the extension regions 24A of the MOSFET 20A, resulting in an extension structure. A silicon nitride film 26A is provided on each of the gate electrodes 21A and serves as a mask material used when the gate electrode is etched and a cap material used when a contact hole is formed in the source/drain region in the SAC (self-aligned contact) process. The gate side-wall 22A is constituted by a side-wall insulation film (first insulator) 22a of a silicon nitride film (first insulative material), and provided on the side-wall of each gate electrode 21A. In this case, each of the MOSFETs 20A is designed based on the minimum design rule and its gate length and gate width are reduced. The gate electrode 21A of the MOSFET 20A formed on the outermost circumference of the cell region !la, has a gate electrode pattern of an electrically independent dummy. This gate electrode pattern allows the SAC process to be applied to the MOSFET 20A formed on the outermost circumference of the cell region.

The peripheral circuit region 11b includes one MOSFET 20B. The MOSFET 20B has a gate electrode 21B provided on the semiconductor substrate 11 with a gate insulation film 23B interposed therebetween. An extension region 24B of a shallow junction, which serves as a source/drain region, is provided in the surface area of the substrate 11 and between the gate electrode 21B and the element isolation region 12. An impurity diffusion region 25B of a deep junction is partly formed at each end portion of the extension regions 24B, resulting in an extension structure. The impurity diffusion region 25B of the MOSFET 20B is so formed that its junction depth is considerably greater than that of the impurity diffusion region 25A of the MOSFET 20A. A silicon nitride film 26B is provided on the gate electrode 21B and serves as a mask material used when the gate electrode is etched and a cap material used when a contact hole is formed in the source/drain region in the SAC process. A gate side-wall 22B the length of which is greater than that of the gate side-wall 22A, is formed on the side-wall portion of the gate electrode 21B. The gate side-wall 22B is constituted by materials each having an etching rate difference, such as a side-wall insulation film 22a of a silicon nitride film and another side-wall insulation film (second insulator) 22b of a silicon oxide film (second insulative material).

An interlayer insulation film 31 is deposited on the semiconductor substrate 11 on which the MOSFETs 20A and 20B are formed, so as to cover the gate electrodes 21A (including dummy gate electrodes 21A') and 21B. The surface of the interlayer insulation film 31 is flattened in advance by the CMP (chemical mechanical polishing) technique.

Contact holes 32A and 32B are formed selectively in the interlayer insulation film 31. Of these holes, the contact hole 32A formed in the cell region 11a is self-aligned with one of the gate electrodes 21A of the MOSFET 20A by the SAC technique. Impurities are ion-implanted through the contact hole 32A, and the above impurity diffusion region 25A of the deep junction is formed in that surface area of the semiconductor substrate 11 which corresponds to the position of the contact hole. The contact hole 32B of the peripheral circuit region 11b is formed on the source/drain region of the MOSFET 20 with a sufficient margin for matching therebetween. Wiring contact portions (diffusion layer contact portions) 33 connected to the source/drain regions of the MOSFETs 20A and 20B, are formed in the contact holes 32A and 32B, with the result that the memory cell section and peripheral circuit section of the DRAM are integrated.

According to the DRAM having the above constitution, the length of the gate side-wall 22A can be scaled in accordance with the scaling rule in the MOSFET 20A of the memory section. At the same time, in the MOSFET 20B of the peripheral circuit section, the gate side-wall 22B can be set to a sufficient length. For this reason, in the memory cell section, a minute contact hole 32A can be formed to be self-aligned with the gate electrode 21A. On the other hand, a source/drain region having a deep-junction structure necessary for forming silicide and suppressing the short-channel effect can easily be formed in the peripheral circuit section. As a result, the performance of the device, which is approaching its limit, can be improved further by the scaling rule.

FIGS. 2A to 2E are cross-sectional views showing the major part of a process of manufacturing a DRAM.

Referring to FIG. 2A, element isolation regions 12 are formed selectively in the surface area of a semiconductor substrate 11 by, for example, STI (shallow trench isolation) or LOCOS (local oxidation of silicon) process. Gate electrode materials are deposited on the substrate 11 with materials for gate insulation films 23A and 23B interposed therebetween and then etched using silicon nitride films 26A and 26B as masks, thereby to form gate electrodes 21A (including dummy gate electrodes 21A') of a MOSFET 20A and a gate electrode 21B of a MOSFET 20B. In the cell region 11a, the gate lengths and gate widths of gate electrodes 21A and dummy gate electrodes 21A' of the MOSFET 20A are reduced to about 0.1 μm. In the peripheral circuit region 11b, the gate length of gate electrode 21B of the MOSFET 20B is as small as about 0.1 μm, while the gate width thereof is set to 10 μm to 20 μm in order to obtain a large current drive.

As shown in FIG. 2B, ion-implantation is performed to form extension regions 24A and 24B. For example, arsenic (As) has only to be ion-implanted at an acceleration energy of 15 keV with a dose of $5 \times 10^{14}$ cm$^{-2}$ in an n-type MOSFET, while BF$_2$ has only to be ion-implanted at an acceleration energy of 10 keV with a dose of $5 \times 10^{14}$ cm$^{-2}$ in a p-type MOSFET. A shallow junction can be formed by rendering Si or Ge preamorphization of substrate depending on the occasion. Under these conditions, the sheet resistance is several times as high as that of an impurity diffusion layer serving as a source/drain region in a normal transistor. However, the high sheet resistance is not a serious problem since an interval between adjacent transistors is small in the memory cell section.

After the extension regions 24A and 24B are formed, a silicon nitride film is deposited and etched back by RIE (reactive ion etching). Thus, a gate side-wall 22A of a side-wall insulation film 22a, which has a length scaled down to 50 nm or less, is formed on the side-wall portion of each of the gate electrodes 21A and 21A' of the MOSFET 20A. Simultaneously, a side-wall insulation film 22a having a length of about 50 nm is formed on the side-wall portion of the gate electrode 21B of the MOSFET 20.

As illustrated in FIG. 2C, for example, a TEOS (tetra ethoxy silane) film 41 of a silicon oxide film type is deposited between the silicon nitride films 26A and 26B for forming the side-wall insulation films 22A. There is a practical etching rate difference between the silicon nitride films and the TEOS film.

Figure 2D:
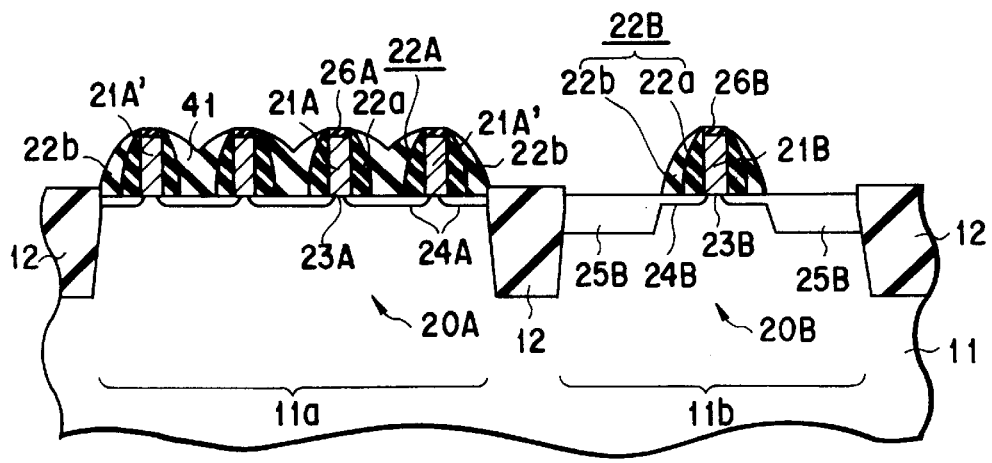

As shown in FIG. 2D, the TEOS film 41 is etched back by RIE. In the MOSFET 20B, a side-wall insulation film 22b is formed outside the side-wall insulation film 22a to obtain a gate side-wall 223 is formed on the side-wall portion of the gate electrode 21B. In the MOSFET 20A, since an interval between adjacent gate electrodes, no side-wall insulation films are formed by the TEOS film 41. The side-wall insulation film 22b is formed on the periphery of each of the. dummy gate electrodes 21A', and the TEOS film 41 between adjacent gate electrodes 21A and 21A' is not etched but remains partly.

After that, masking (not shown) is executed to form an impurity diffusion region 25B of a deep junction, and ions are implanted. For example, in the n-type MOSFET, arsenic (As) has only to be ion-implanted at an acceleration energy of 50 keV with a dose of $3 \times 10^{15}$ cm$^{-2}$ in an n-type MOSFET, while BF$_2$ has only to be ion-implanted at an acceleration energy of 35 keV with a dose of $3 \times 10^{15}$ cm$^{-2}$ in a p-type MOSFET. Thus, the deep-junction impurity diffusion region 25B is formed in the extension region 24B of the MOSFET 20B at a position away from the gate electrode 21B by the length of the gate side-wall 22B (i.e., a position away from the side-wall insulation film 22a by the length of the side-wall insulation film 22b), thereby decreasing in contact resistance and sheet resistance.

Figure 2E:
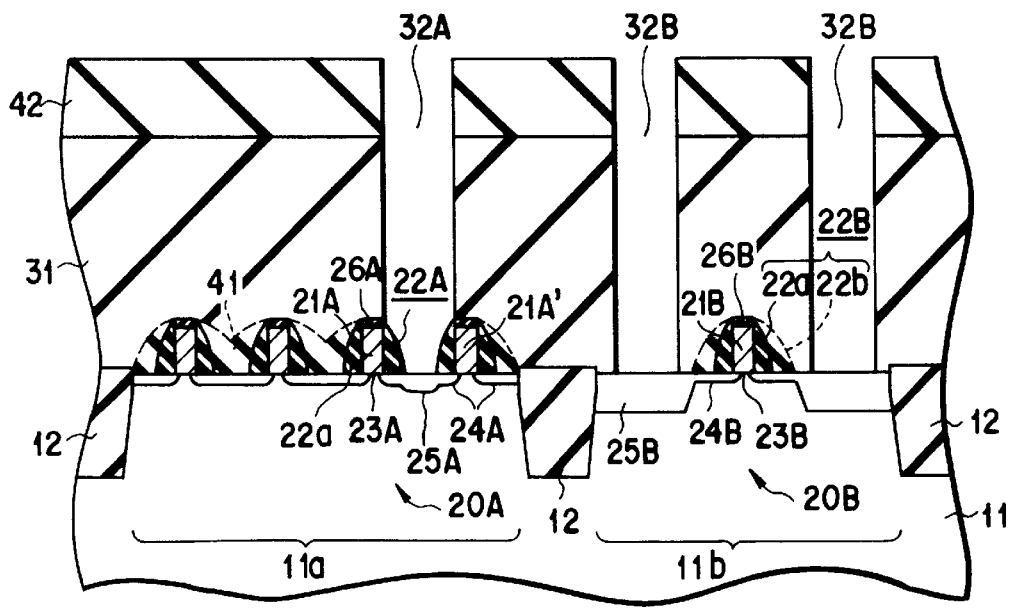

Referring to FIG. 2E, silicon oxide film type materials, which are used to form an interlayer insulation film 31, are deposited on the entire surface of the resultant structure, and its surface is flattened by CMP. It is important to form the film 31 by materials, there being a practical etching rate difference between the materials and the silicon nitride films for forming the side-wall insulation film 22a.

Through the RIE process, the interlayer insulation film 31 is etched in accordance with a resist pattern 42 to form both a contact hole 32A communicating with the source/drain region of the MOSFET 20A and a contact hole 32B communicating with the source/drain region of the MOSFET 20B. At the forming position of the contact hole 32A, the TEOS film 41 remaining between the gate electrodes 21A and 21A' of the MOSFET 20A is removed together with the interlayer insulation film 31, but the side-wall insulation film 22a is not eliminated. Since, therefore, the SAC process can be applied to the MOSFET 20A, the contact hole 32A can be self-aligned with the gate electrode 21A. The gate electrode 21A' on the outermost circumference of the MOSFET 20A has a dummy gate electrode pattern. If, therefore, the SAC process is executed using the dummy gate electrode 21A', the contact hole 32A can be prevented from shifting on the element isolation region 12. It is thus possible to eliminate a drawback of increasing in junction leak current due to an over-etching of the element isolation region 12. In the MOSFET 20B, the contact hole 32b can be formed with a sufficient margin for matching both the gate electrode 21B and element isolation region 12, without executing the SAC process.

After the resist pattern 42 is removed, masking (not shown) is executed to form an impurity diffusion region 25A of a deep junction, and ions are implanted through the contact hole 32A. Then, RTA (rapid thermal annealing) for activating the ion-implanted impurities is performed. Thus, the deep-junction impurity diffusion region 25A is formed in the extension region 24A at a position away from the gate electrodes 21A and 21A' by the length of the gate side-wall 22A (i.e., the gate side-wall 22a), thereby decreasing in contact resistance. In this case, the junction depth of the impurity diffusion region 25A is set greater than that of the impurity diffusion region 25B by varying the ion-implantation conditions. The reason is as follows. When the elements are isolated by the STI, a damage due to ion implantation has to be small in order to suppress crystal defects in the cell region 11a including memory cells an interval between which is small. Consequently, only the conditions for forming the impurity diffusion region 25A in the MOSFET 20A, such as a dose and an acceleration energy, without degrading the performance of the MOSFET 20B.

After that, conductive wiring materials are deposited on the interlayer insulation film 31 so as to fill the contact holes 32A and 32B. The wiring materials are patterned to form wiring contact portions 33 connected to the source/drain regions of the MOSFETs 20A and 20B, thereby achieving the memory cell section and the peripheral circuit section of the DRAM shown in FIG. 1.

In the foregoing DRAM of the first embodiment, the extension structure is adopted in the source/drain region of the MOSFET 20B in the peripheral circuit section. The present invention is not limited to this structure, but can be applied to a structure which relaxes the parasitic resistance using the salicide technique.

(Second Embodiment)

Figure 3A:
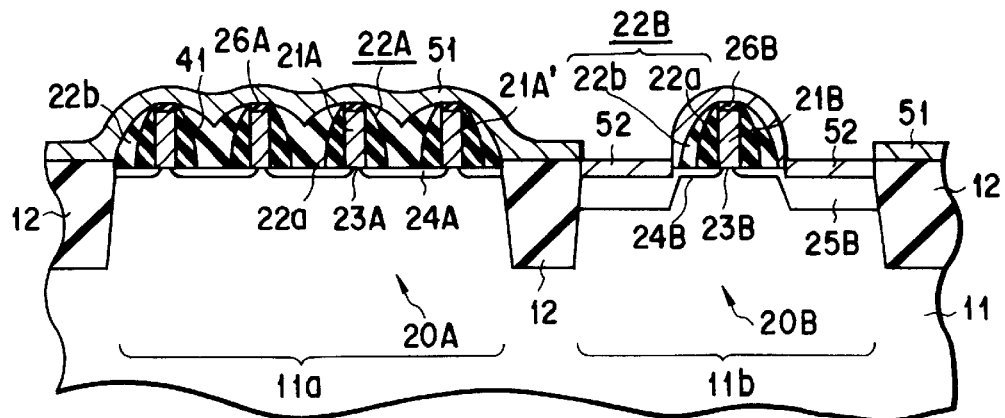
FIGS. 3A to 3C are cross-sectional views showing the major part of a process of manufacturing a DRAM according to a second embodiment of the present invention.
Figure 3B:
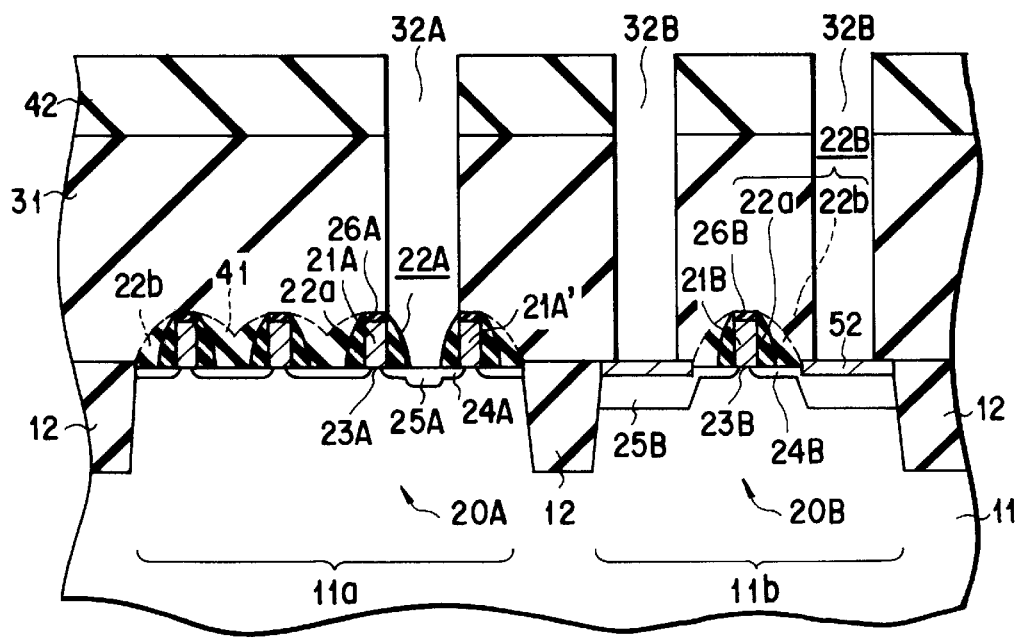
Figure 3C:
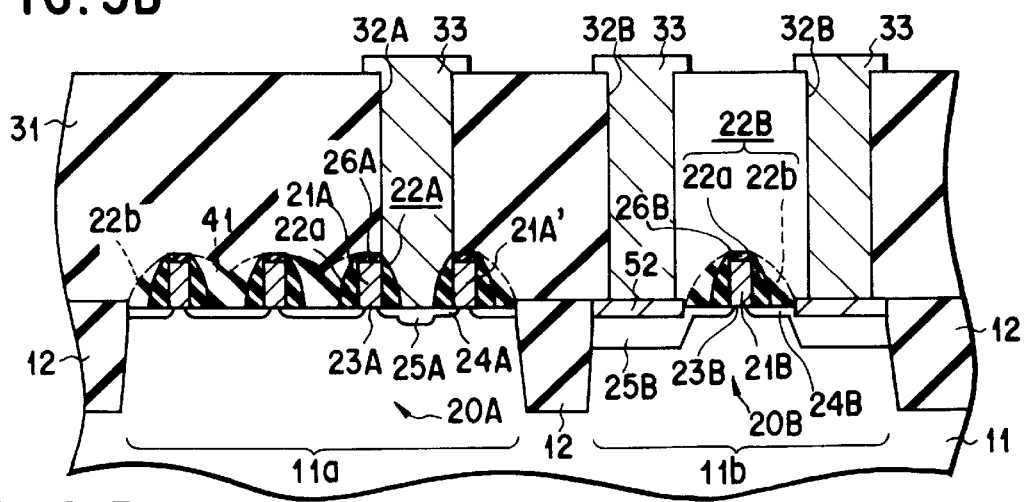

FIGS. 3A to 3C are cross-sectional views illustrating the major part of a process of manufacturing a DRAM according to a second embodiment of the present invention.

As in the manufacturing process of the DRAM of the first embodiment, an impurity diffusion region 25B of a deep junction is formed outside an extension region 24B serving as a source/drain region of the MOSFET 20B (FIG. 2D) and then refractory metal (e.g., Ti film) 51 is deposited all over the surface of the resultant structure by sputtering to execute the salicide process. After that, a silicide layer (low-resistance region) 52 is formed on only the surface of the source/drain region of the MOSFET 20B by RTA (FIG. 3A).

Residual titanium (Ti) is resolved using a mixed solution of sulfuric acid and hydrogen peroxide to prevent gate electrodes 21A and 21A' in a cell region 11a from being short-circuited and also prevent a gate electrode 21B and the silicide layer 52 in a peripheral circuit region 11b from being short-circuited. The silicide layer 52 is thus formed to extend to an element isolation region 12 from a position away from a gate electrode 21B by the length of the gate side-wall 22B. In other words, the silicide layer 52 is formed on the surface of the source/drain region of the MOSFET 20B at a position which is very far away from the gate electrode 21B by the length of each of the side-wall insulation films 22a and 22b.

Silicon oxide film type materials, which are used to form an interlayer insulation film 31, are deposited on the entire surface of the resultant structure, and the surface of the deposited materials is flattened through the CMP process. The interlayer insulation film 31 is etched by the RIE process in accordance with a resist pattern 42, thereby forming both a contact hole 32A communicating with the source/drain region of the MOSFET 20A and a contact hole 32B communicating with the silicide layer 52 on the source/drain region of the MOSFET 20B.

After the resist pattern 42 is removed, masking (not shown) is executed and impurities are ion-implanted through the contact hole 32A. Then, RTA is performed to activate the ion-implanted impurities and transit the phase of the silicide layer 52. Therefore, an impurity diffusion region 25A, the junction of which is shallow than that of the impurity diffusion region 25B in the MOSFET 20B but deeper than that of the extension region 24A, is formed in an extension region 24A at a position away from each of the gate electrodes 21A and 21A' by the length of the gate side-wall 22A, thereby to decrease in contact resistance (FIG. 3B).

Thereafter, conductive wiring materials are deposited on the interlayer insulation film 31 so as to fill the contact holes 32A and 32B. The wiring materials are patterned to form wiring contact portions 33, thereby achieving a memory cell section and its peripheral circuit section of the DRAM which is constituted so as to relax the parasitic resistance by the salicide process (FIG. 3C).

According to the DRAM of the second embodiment so constituted, not only substantially the same advantage as that of the DRAM of the first embodiment can be expected, but also the silicide layer 52 can selectively be formed only on the source/drain region of the MOSFET 20B by sufficiently lengthening the gate side-wall 22 in order to increase the current driving performance while preventing the short-channel effect in the MOSFET 20B of the peripheral circuit section. Thus, the junction depth of the source/drain region can be increased sufficiently, and the resistance of the impurity diffusion region 25B outside the gate side-wall 22B can be decreased sufficiently. The junction leakage current due to formation of the silicide layer 52, is completely suppressed in the transistor of the cell section, and the parasitic resistance of the peripheral circuit section can easily be relaxed. Furthermore, the silicide layer 52 can selectively be formed only on the impurity diffusion region 25B which is exposed after the side-wall insulation film 22b is eliminated. Hence a lithography process for patterning a silicide layer, which has been needed conventionally, can be deleted.

The present invention is not limited to the above embodiment wherein the wiring contact portions 33 in the MOSFET 20A are formed by the same wiring material. For example, a part of the wiring materials can easily be constituted of metal such as tungsten (W) or polysilicon which is doped with impurities such as phosphorus (P).

(Third Embodiment)

Figure 4A:
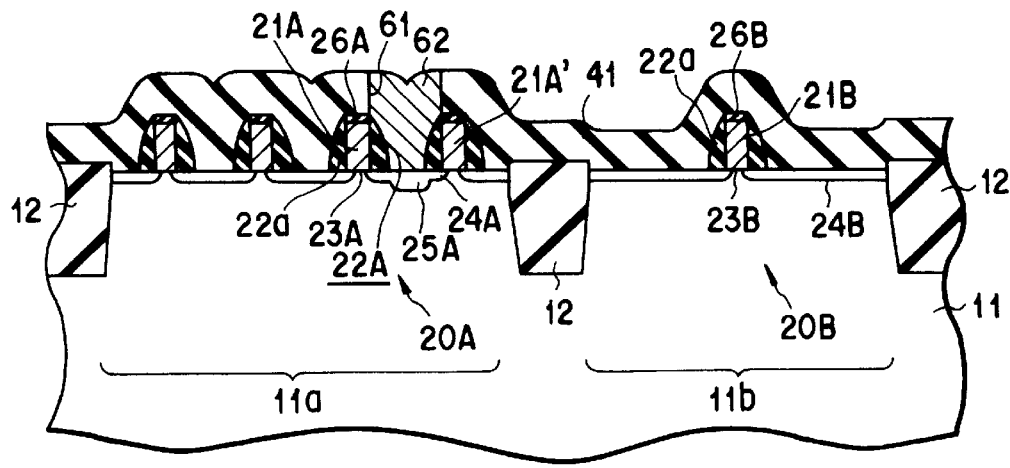
FIGS. 4A to 4C are cross-sectional views showing the major part of a process of manufacturing a DRAM according to a third embodiment of the present invention.
Figure 4B:
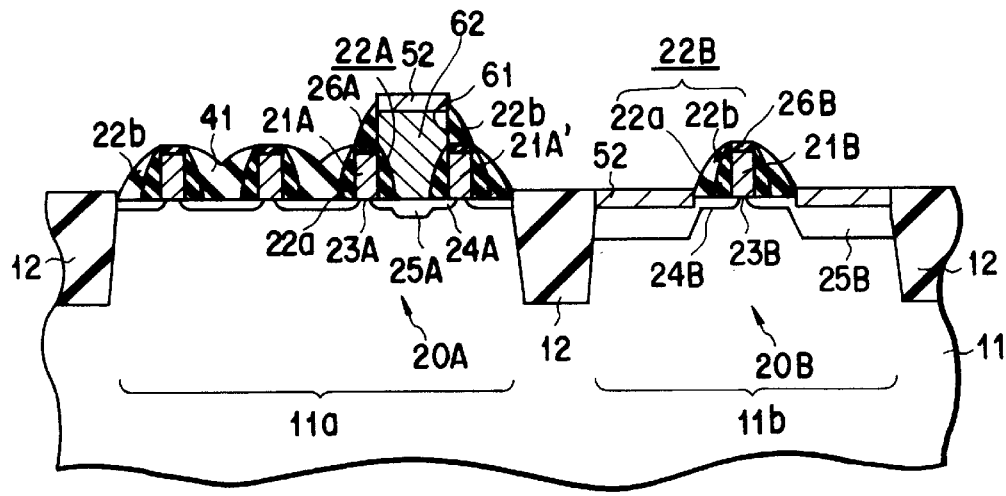
Figure 4C:
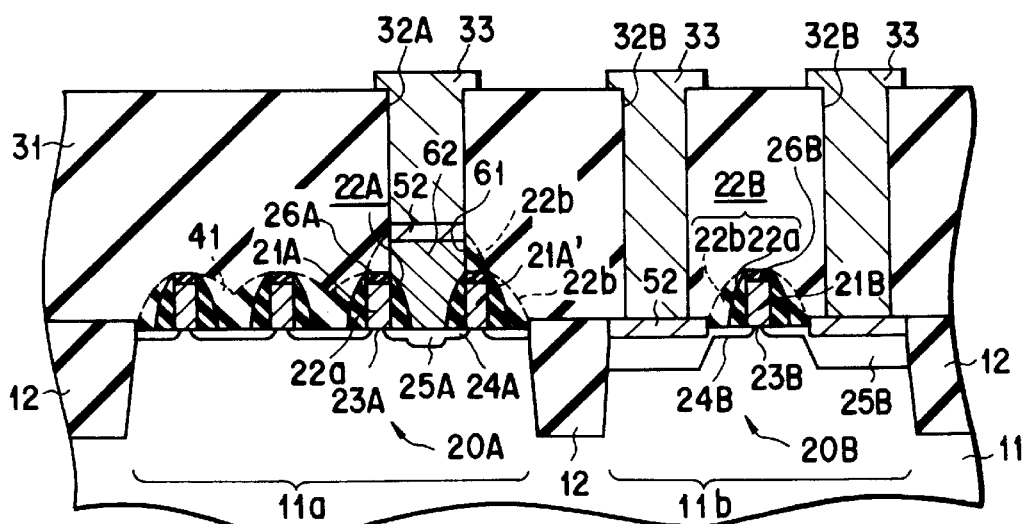

FIGS. 4A to 4C are cross-sectional views illustrating the major part of a process of manufacturing a DRAM according to a third embodiment of the present invention.

As in the manufacturing process of the DRAM of the first embodiment, the TEOS film 41 is formed on the side-wall portion of the gate electrode 21B in the MOSFET 20B (FIG. 2C). Then a contact hole 61 communicating with the source/drain region of the MOSFET 20A is formed by the SAC process. When the need arises, masking (not shown) for forming the impurity diffusion region 25A of a deep junction is performed, and ions are implanted through the contact hole 61. The contact hole 61 is filled with conductive materials such as tungsten (W) or polysilicon which is doped with a large amount of phosphorus (P) to form a contact portion 62 (FIG. 4A).

Then the TEOS film 41 is etched back by RIE. In the MOSFET 20B, a side-wall insulation film 22b is formed outside the side-wall insulation film 22a to obtain a gate side-wall 22B is formed on the side-wall portion of the gate electrode 21B. In the MOSFET 20A, the side-wall insulation film 22b is formed on the periphery of each of the dummy gate electrodes 21A', and that of the contact portion 62, while the TEOS film 41 between adjacent gate electrodes 21A and 21A' is not etched but remains as it is.

After that, masking (not shown) is executed to form an impurity diffusion region 25B of a deep junction, and ions are implanted. Thus, the deep-junction impurity diffusion region 25B is formed in the extension region 24B of the MOSFET 20B at a position away from the gate electrode 21B by the length of the gate side-wall 22B, thereby decreasing in contact resistance.

After that, refractory metal (not shown) is deposited all over the surface by sputtering to execute the salicide process. Then, by executing the RTA, a silicide layer 52 is formed on the surface of the source/drain region of the MOSFET 20B by RTA and that of the contact portion 62 (FIG. 4B).

The residual refractory metal is resolved and eliminated using a mixed solution of sulfuric acid and hydrogen peroxide, and silicon oxide film type materials, which are used to form an interlayer insulation film 31, are deposited on the entire surface of the resultant structure, and its surface is flattened by the CMP process. Both a contact hole 32A communicating with the silicide layer 52 on the surface of the contact portion 62 in the MOSFET 20A and contact hole 32B communicating with the silicide layer 52 on the source/drain region in the MOSFET 20B, are formed by the RIE process.

Conductive wiring materials are deposited on the interlayer insulation film 31 so as to fill the contact holes 32A and 32B. The wiring materials are patterned to form wiring contact portions 33, thereby achieving a memory cell section and its peripheral circuit section of the DRAM which is constituted so as to lower the contact resistance of the MOSFET 20A as well as relax the parasitic resistance by the salicide process (FIG. 4C).

According to the DRAM so constituted, substantially the same advantage as that of the DRAM of the second embodiment can be expected. Since, furthermore, polysilicon which allows contact resistance to decrease, is used in part of each of the wiring contact portions 33 in the MOSFET 20A, the contact resistance of the memory cell section can be lowered further. In the MOSFET 20A, the contact resistance can be decreased without forming the deep-junction impurity diffusion region 25A in the extension region 24A. Therefore, ion implantation for forming a deep junction of the source/drain region has only to be performed only once at least for the MOSFET 20B. In both MOSFETs 20A and 20B, the contact holes 32A and 32B can be formed using the silicide layer 52 as barrier metal.

In any case, since the source/drain region of the MOSFET 20A of the memory section is not formed as silicide, it is able to keep a junction leakage current small and thus particularly suitable for integrating memory devices.

Furthermore, in the MOSFET 20A, the contact hole 32A can be formed to be self-aligned with the gate electrodes 21A and 21A'.

(Fourth Embodiment)

Figure 5A:
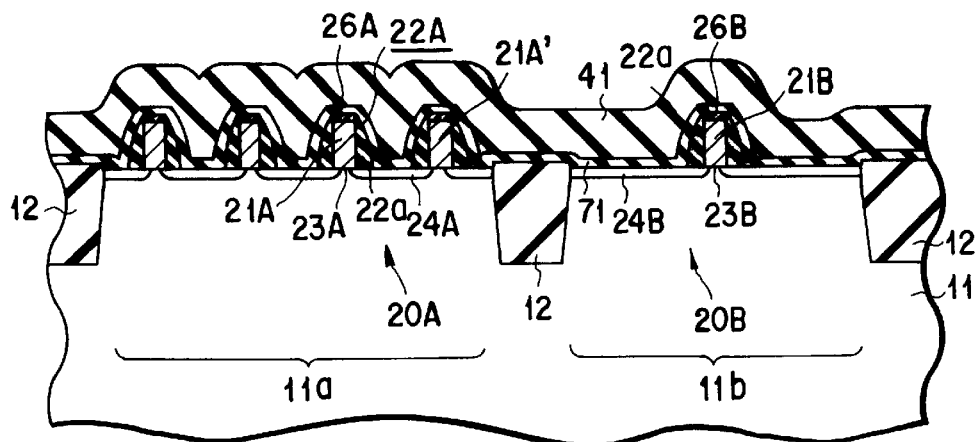
FIGS. 5A to 5C are cross-sectional views showing the major part of a process of manufacturing a DRAM according to a fourth embodiment of the present invention.
Figure 5B:
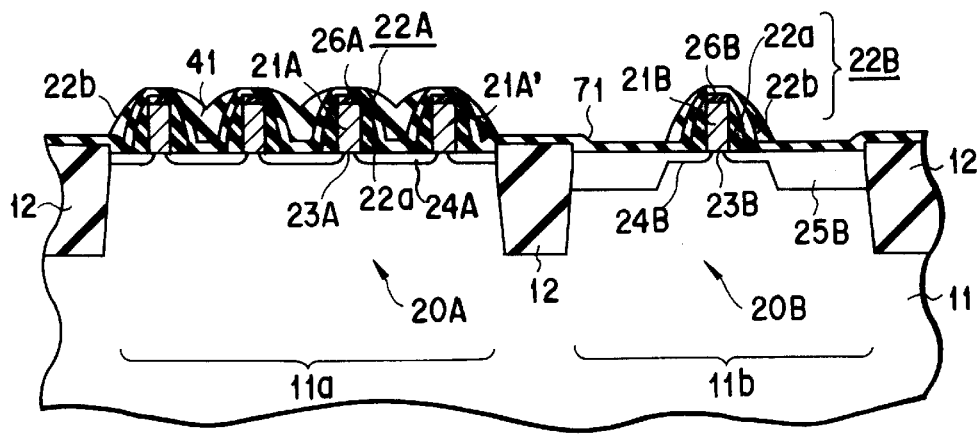
Figure 5C:
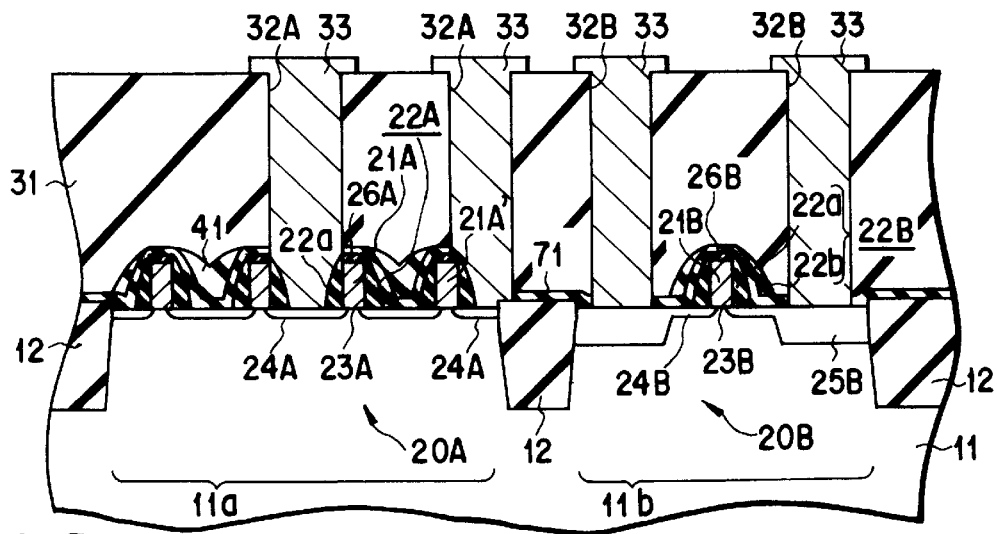

FIGS. 5A to 5C are cross-sectional views illustrating the major part of a process of manufacturing a DRAM according to a fourth embodiment of the present invention.

As in the manufacturing process of the DRAM of the first embodiment, a side-wall insulation film 22a is formed in each of MOSFETs 20A and 20B (FIG. 2B). After that, a silicon nitride film (third insulation film) 71 is deposited on the entire surface. This film 71 has a thickness so as not to be eliminated by the SAC process and is considerably thinner than a silicon nitride film for forming the side-wall insulation film 22a, taking into consideration the etching rate difference of the film 71 to the film 31. After the silicon nitride film 71 is formed, a TEOS film 41 for forming a side-wall insulation film 22b is deposited on the entire surface of the resultant structure (FIG. 5A).

The TEOS film is etched back by the RIE process. If the film 41 is etched so as to leave the silicon nitride film 71, in the MOSFET 20B, the side-wall insulation film 22b is formed outside the side-wall insulation film 22a with the thin silicon nitride film 71 interposed therebetween, thus obtaining a gate side-wall 22B on a gate electrode 21B. In the MOSFET 20A, the side-wall insulation film 22b is formed on the side-wall portion of the outer circumference of a dummy gate electrode 21A', but the TEOS film 41 between the gate electrodes 21A and 21 is not etched but remains as it is.

After that, masking (not shown) is executed to form an impurity diffusion region 25B of a deep junction, and impurity ions are implanted through the silicon nitride film 71. Thus, the deep-junction impurity diffusion region 25B is formed in the extension region 24B of the MOSFET 20B at a position away from the gate electrode 21B by the length of the gate side-wall 22B, thereby decreasing in contact resistance (FIG. 5B).

Silicon oxide film type materials, which are used to form the interlayer insulation film 31, are deposited on the entire surface of the resultant structure, and its surface is flattened by the CMP process. Both a contact hole 32A communicating with the source/drain region of the MOSFET 20A and a contact hole 32B communicating with that of the MOSFET 20B, are formed by the RIE process. In the MOSFET 20A, the interlayer insulation film 31 and TEOS film 41 are selectively etched such that the contact hole 32A is self-aligned with the gate electrodes 21A and 21A' and element isolation region 12.

The silicon nitride film 71 remaining in the contact holes 32A and 32B is removed by dry etching or wet etching using hot phosphoric acid. Since, in the wet etching, a silicon oxide film is hardly etched, only the thin silicon nitride film can be eliminated. Thus, even when the contact hole 32A is formed to be self-aligned with the element isolation region 12, the region 12 is etched too much, with the result that the junction leakage current can be prevented from increasing.

After that, conductive wiring materials are deposited on the interlayer insulation film 31 so as to fill the contact holes 32A and 32B. The wiring materials are patterned to form wiring contact portions 33 communicating with the source/drain regions of the MOSFETs 20A and 20B, thereby achieving a memory cell section and its peripheral circuit section of the DRAM which is constituted such that the contact hole 32A is self-aligned with both the gate electrodes 21A and 21A' and the element isolation region 12 (FIG. 5C).

According to the DRAM of the fourth embodiment so constituted, not only substantially the same advantage as that of the DRAM of the first embodiment can be expected, but also the contact hole 32A can be self-aligned with both the gate electrodes 21A and 21A' and the element isolation region 12 without increasing in junction leakage current.

In the DRAM of the fourth embodiment, the gate electrode 21A' on the outermost circumference of the memory cell section need not always have an electrically independent dummy gate electrode pattern. Even though the gate electrode 21A is electrically active, the element isolation region 12 is not removed, but the junction leakage current due to the contact hole 32A can be prevented from increasing.

(Fifth Embodiment)

Figure 6A:
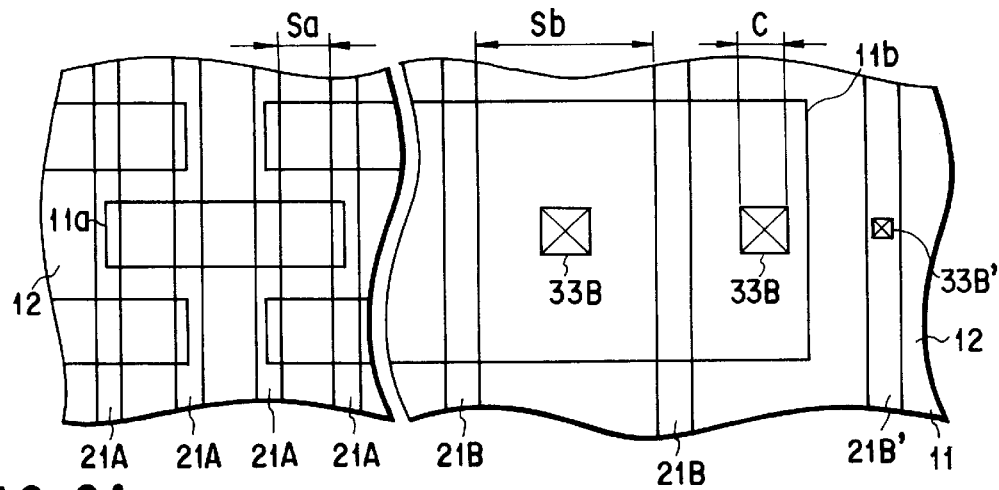
FIGS. 6A and 6B are views illustrating the major part of a DRAM according to a fifth embodiment of the present invention.
Figure 6B:
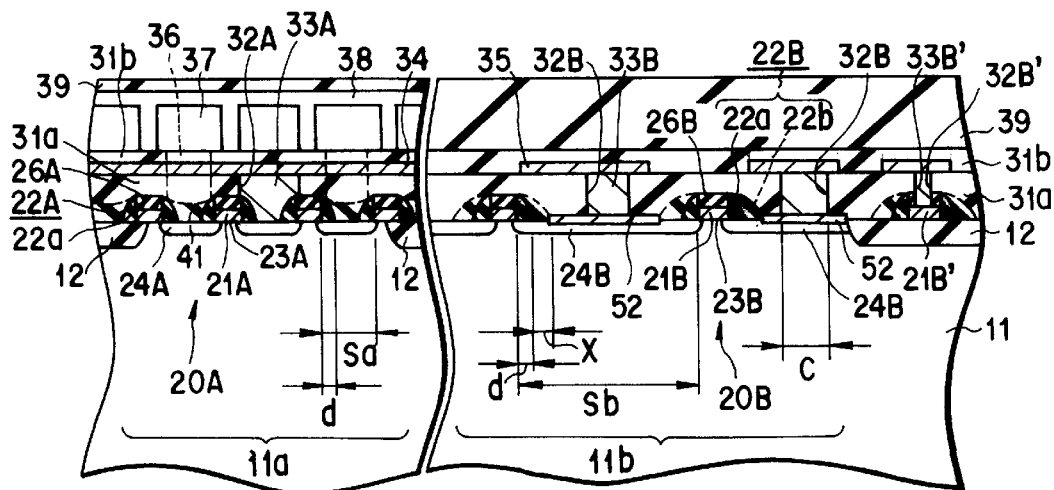

FIGS. 6A and 6B illustrate the constitution of a DRAM according to a fifth embodiment of the present invention. FIG. 6A is a plan view of the layout pattern of the DRAM, while FIG. 6B is a cross-sectional view thereof.

The DRAM of the fifth embodiment has a MIS structure in which a plurality of first and second MOSFETs 20A and 20B are integrated on a semiconductor substrate 11. On part or all of the surface of source/drain region 24B in the MOSFET 20B constituting a peripheral circuit section, a silicide layer 52 having a lower resistance than that of the source/drain region is formed.

A process of manufacturing the above DRAM will now be described in brief.

In the cell region 11a, gate electrodes 21A of the MOSFET 20A are formed on the semiconductor substrate 11 isolated from an element isolation region 12, and a gate insulation film 23B is interposed between each of the gate electrodes 21A and the semiconductor substrate 11. In the peripheral circuit region 11b, gate electrodes 21B of the MOSFET 20B are formed on the substrate 11 with a gate insulation film 23B interposed therebetween. A gate electrode 21B' is formed on the element isolation region 12 but not through any gate insulation film. A silicon nitride film 26A and a silicon nitride film 26B are formed on the gate electrodes 21A, 21B and 21B' as mask materials for etching the gate electrodes. After that, impurities are implanted into the surface portion of the semiconductor substrate 11 to form a source/drain region 24A of the MOSFET 20A and a source/drain region 24B of the MOSFET 20B.

The silicon nitride films are deposited on the entire surface of the resultant structure and etched back to form a side-wall insulation film 22a, serving as a gate side-wall 22A, on a side-wall portion of the gate electrode 21A of the MOSFET 20A. At the same time, a side-wall insulation film 22a, which serves as part of a gate side-wall 22B, is formed on the side-wall portion of each of the gate electrodes 21B and 21B'.

A TEOS film 41 is deposited on the entire surface of the resultant structure and then etched back by the RIE. A space between the gate electrodes 21A is filled with the TEOS film 41, while a side-wall insulation film 22b is formed only on the side-wall portion of each of the gate electrodes 21B and 21B', and a gate side-wall 22B is obtained by the side-wall insulation films 22a and 22b.

Refractory metal (e.g., Ti film and TiN film) is deposited all over the surface of the resultant structure by sputtering or CVD to execute the salicide process. The RTA process is executed to form a silicide layer 52 whose resistance is lower than that of the source/drain region 24B on the surface of the source/drain region 24B in at least one MOSFET 20B.

After the residual refractory metal is eliminated, a first interlayer insulation film 31a is deposited on the entire surface of the semiconductor substrate 11 and its surface is flattened by the CMP process. Then, a contact hole 32A communicating with the source/drain region 24A is formed to be self-aligned with one of the gate electrodes 21A of the MOSFET 20A by the SAC process.

A contact hole 32B is formed in the silicide layer 52 formed on the surface of the source/drain region 24B of the MOSFET 20B with a sufficient margin for matching, and the contact hole 32B communicates with the silicide layer 52.

At the same time, a contact hole 32B' is formed in the first interlayer insulation film 31a through the silicon nitride film 26B formed on the gate electrode 21B' provided on the element isolation region 12. After the contact hole 32B' is formed, the silicon nitride film 26B remaining therein has only to be removed by hot phosphoric acid.

The contact holes 32A, 32B and 32B' are filled with wiring materials to form a bit-line contact portion (wiring contact portion) 33A communicating with the source/drain region in the MOSFET 20A and a diffusion layer contact portion (wiring contact portion) 33B connected to the silicide layer 52 on the surface of the source/drain and a contact portion 33B' connected to the surface of the gate electrode 21B' in the MOSFET 20B.

After that, a bit line 34 to which the bit-line contact portion 33A is connected is formed on the first interlayer insulation film 31a in the cell region 11a, and a first wiring layer 35 to which the contact portions 33B and 33B' are connected is formed on the first interlayer insulation film 31a in the peripheral circuit region 11b.

A second interlayer insulation film 31b is deposited on the entire surface of the resultant structure, and a diffusion layer contact portion 36 communicating with the source/drain region 24A of the MOSFET 20 is formed in the first and second interlayer insulation films 31a and 31b of the cell region 11a. A plurality of storage electrodes 37 connected to the diffusion layer contact portion 36 are formed on the second interlayer insulation film 31b, and so is a plate electrode 38 with a capacitor insulation film (not shown) interposed therebetween.

Thereafter, an insulation film 39 is deposited on the entire surface thereby to form a memory cell section and a peripheral circuit section of the DRAM.

The memory cell section and peripheral circuit section of the DRAM having the above constitution are so designed that an interval Sa between the gate electrodes 21A of the memory cell section is smaller than 2(x+d) and an interval Sb between the gate electrodes 21B of the peripheral circuit section is larger than 2(x+d), where d is the side-wall length of side-wall insulation film 22a and x is the side-wall length of side-wall insulation film 22b. Actually, it is desirable to set the interval Sb larger than 2(x+d)+c, considering the size (C) of the diffusion layer contact portion 33B in the peripheral circuit section.

According to the DRAM of the fifth embodiment so constituted, by the single process, the side-wall insulation film 22b can be formed only on the side-wall portion of each of the gate electrodes 21B in the peripheral circuit section with the TEOS film 41 interposed between the gate electrodes 21A of the memory cell section. The silicide layer 52 can thus be formed only on that surface of the source/drain region 24B of the MOSFET 20B in the peripheral circuit section which is exposed after the side-wall insulation film 22b is formed.

In other words, the silicide layer 52 is always formed on the surface of the source/drain region 24B of the MOSFET 20B in the peripheral circuit section with a distance between the silicide layer 52 and the side-wall insulation films 22a, which is almost equal to the length x of the side-wall insulation film 22b. For high-speed signal processing, the silicide layer 52 is formed automatically on the exposed portion of the surface of the source/drain region 24B of the MOSFET 20B in the peripheral circuit section, so that the patterning for forming the silicide layer 52 can be omitted. Therefore, even in order to improve in processing speed in the peripheral circuit section, a DRAM that mingles the memory cell section and its peripheral circuit section can easily be achieved without increasing the number of lithographic steps.

(Sixth Embodiment)

Figure 7:
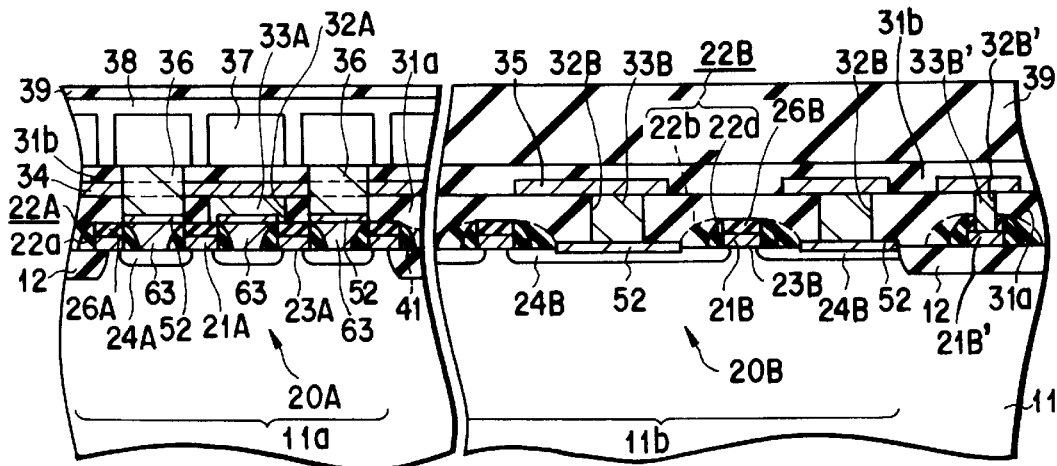
FIG. 7 is a cross-sectional view illustrating the main part of a DRAM according to a sixth embodiment of the present invention.

FIG. 7 illustrates the constitution of a DRAM according to a sixth embodiment of the present invention.

The DRAM of the sixth embodiment has the following constitution in addition to that of the DRAM of the fifth embodiment. Polysilicon doped with impurities are buried between gate electrodes 21A of each MOSFET 20A in the memory cell section to form a contact portion 63 and also form a silicide layer 52 both on the surface of the source/drain region 24B in at least one MOSFET 20B and on the upper surface of the contact portion 63.

According to the DRAM of the sixth embodiment, for example, polysilicon, which is to allow contact resistance to decrease, is used in part of a bit line contact portion 33A and a diffusion layer contact portion 36 of the MOSFET 20A; therefore, the contact resistance of the MOSFET 20A can be lowered, i.e., substantially the same advantage as that of the DRAM of the third embodiment can be expected.

(Seventh Embodiment)

FIGS. 8A to 8F are cross-sectional views schematically showing the major part of a process of manufacturing a DRAM according to a seventh embodiment of the present invention. These figures simply show a peripheral circuit section involved in the formation of a silicide layer 52.

Figure 8A:
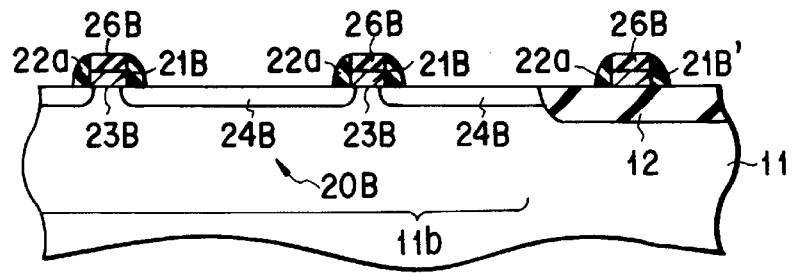
FIGS. 8A to 8F are cross-sectional views showing the major part of a process of manufacturing a DRAM according to a seventh embodiment of the present invention.
Figure 8B:
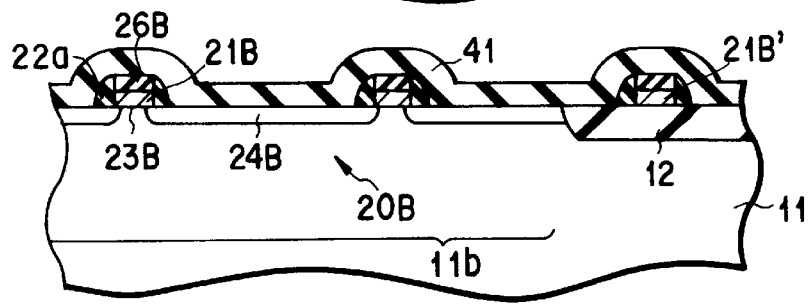
Figure 8C:
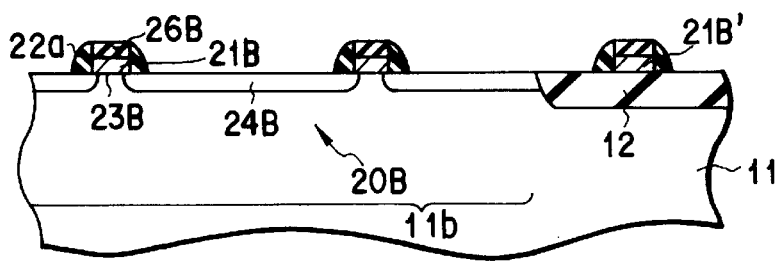
Figure 8D:
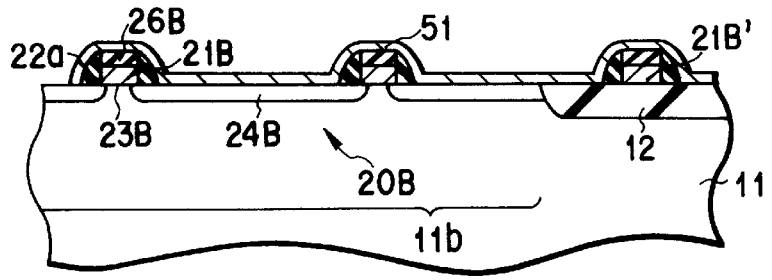

As in the process of manufacturing the DRAM of the fifth embodiment, a side-wall insulation film 22a is formed on the side-wall portion of each of gate electrodes 21B and 21B' (FIG. 8A). After that, a TEOS film 41 is deposited on the entire surface of the resultant structure (FIG. 8A) and then etched back by isotropic etching, thereby leaving the TEOS film 41 between gate electrodes 21A of each MOSFET 20A in the memory cell section but removing all the TEOS film 41 of the peripheral circuit section (FIG. 8C).

Figure 8E:
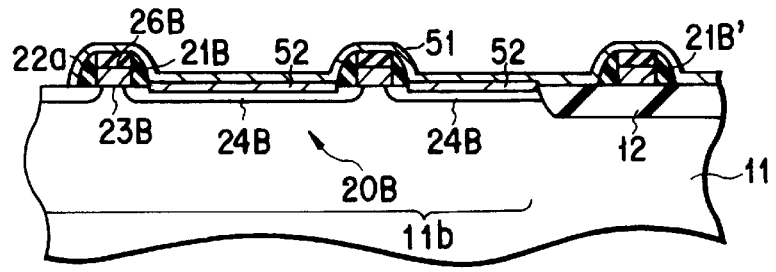

Next, refractory metal (e.g., Ti film and TiN film) 51 is deposited all over the surface of the resultant structure by sputtering or CVD to execute the salicide process (FIG. 8D), and the RTA process is executed to form a silicide layer 52 in the interface between the refractory metal 51 and source/drain region 24B (FIG. 8E).

Figure 8F:
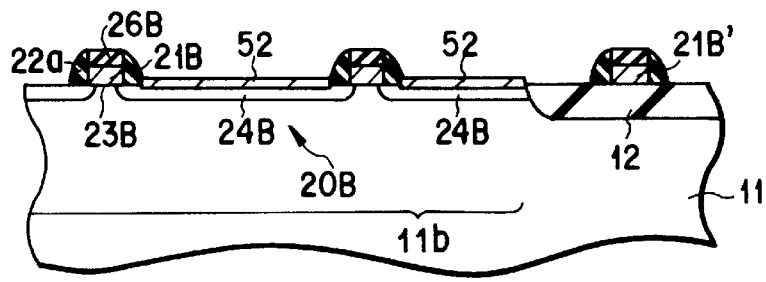

If, after that, the surplus refractory metal 51 is removed, a silicide layer 52 the resistance of which is lower than that of the source/drain region 24B, can be formed on the surface of the region 24B in at least one of the MOSFETs 20B (FIG. 8F).

As described above, even when all the TEOS film 41 of the peripheral circuit section is removed by isotropic etching, a silicide layer 52 can be formed on the surface of the source/drain region 24B of the MOSFET 20B without any lithography process, thus improving in processing speed in the peripheral circuit section.

For example, even when the present invention is applied to the DRAM of the first embodiment wherein no silicide layer is formed, the extension structure can easily be obtained in the peripheral circuit section without increasing in lithographic steps.

(Eighth Embodiment)

FIGS. 9A to 9F are cross-sectional views schematically showing the major part of a process of manufacturing a DRAM according to an eighth embodiment of the present invention. These figures simply show a peripheral circuit section involved in the formation of a silicide layer 52.

Figure 9A:
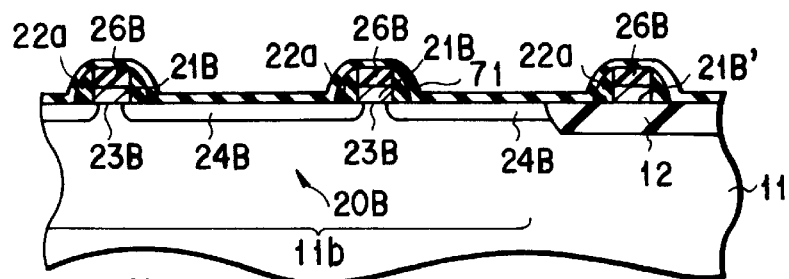
FIGS. 9A to 9F are cross-sectional views showing the major part of a process of manufacturing a DRAM according to an eighth embodiment of the present invention.
Figure 9B:
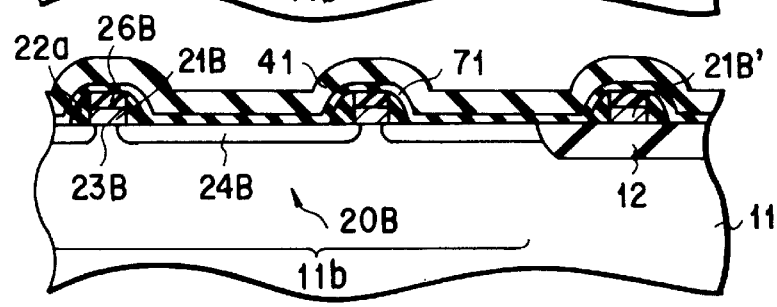
Figure 9C:
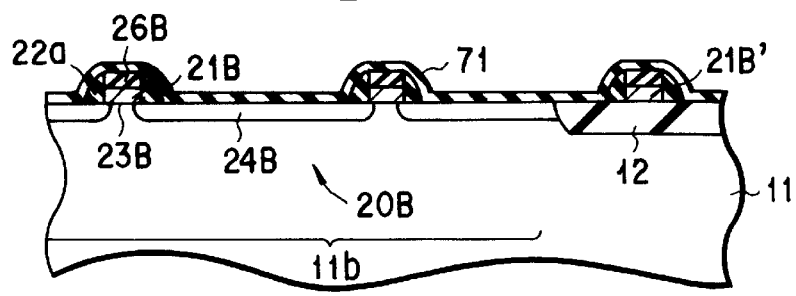

As in the process of manufacturing the DRAM of the fifth embodiment, a side-wall insulation film 22a is formed on the side-wall portion of each of gate electrodes 21B and 21B' and then a silicon nitride film 71 is deposited on the entire surface of the resultant structure (FIG. 9A). A TEOS film 41 is deposited on the silicon nitride film 71 (FIG. 9B) and then etched back by isotropic etching, thereby leaving the TEOS film 41 between gate electrodes 21A of each MOSFET 20A in the memory cell section but removing all the TEOS film 41 of the peripheral circuit section (FIG. 9C).

Figure 9D:
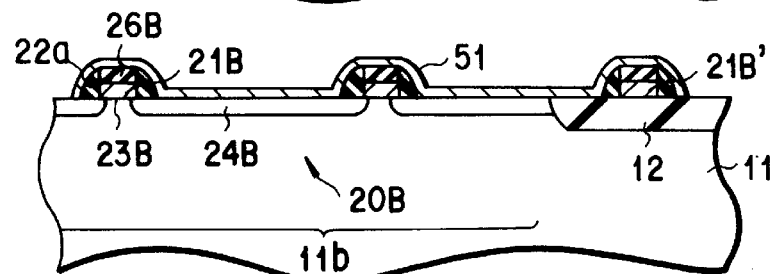
Figure 9E:
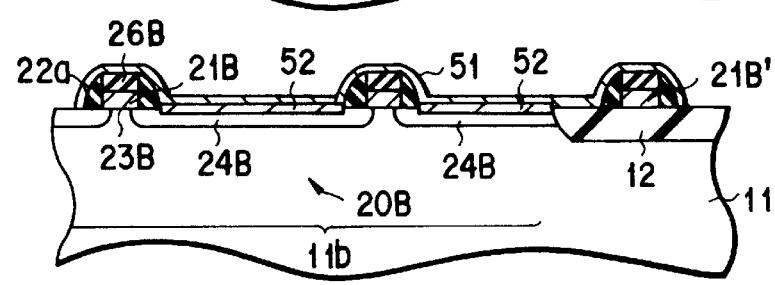

Next, the silicon nitride film 71 is removed from the surface of the source/drain region 24B and refractory metal 51 is deposited by sputtering or CVD (FIG. 9D). The RTA is executed to form a silicide layer 52 in the interface between the refractory metal 51 and source/drain region 24B (FIG. 9E).

Figure 9F:
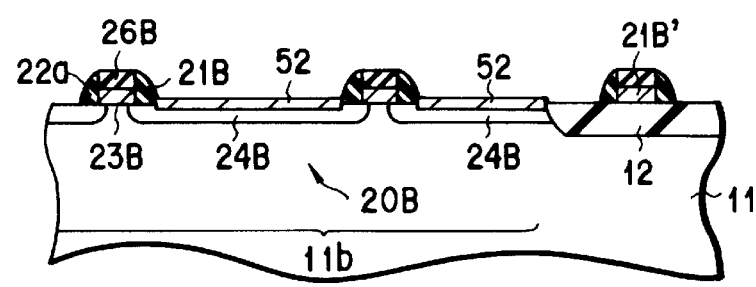

If, after that, the surplus refractory metal 51 is removed, a silicide layer 52 the resistance of which is lower than that of the source/drain region 24B, can be formed on the surface of the region 24B in at least one of the MOSFETs 20B (FIG. 9F).

If, as in the DRAM of the eighth embodiment, a silicon nitride film 71 having a considerably high etching rate difference to the TEOS film 41 is formed before the film 41 is deposited, not only a silicide layer 52 can be formed without any lithography process, but also an etching damage such as a hollow on the surface of the semiconductor substrate 11 can be reduced since the silicon nitride film 71 serves as a stopper for eliminating the TEOS film 41.

In the above-described DRAM of the fifth embodiment, the gate side-wall 22B of the peripheral circuit section is formed using a silicon oxide film and a silicon nitride film. The present invention is not limited to this. For example, it can be formed by a combination of organic type low dielectric films.

For example, an oxide film to which impurities such as phosphorus and boron are added, phosphoric glass, BPSG or the like is employed as the second insulator for forming the side-wall insulation film 22b.

In the foregoing DRAM, both the side-wall insulation film 22b and interlayer insulation film 31a are formed using silicon oxide film type materials. However, the present invention is not limited to this.

The following are examples of the constitution of the MOSFET 20B used in the peripheral circuit section of the DRAM according to the fifth embodiment (see FIGS. 6A and 6B).

Figure 10A:
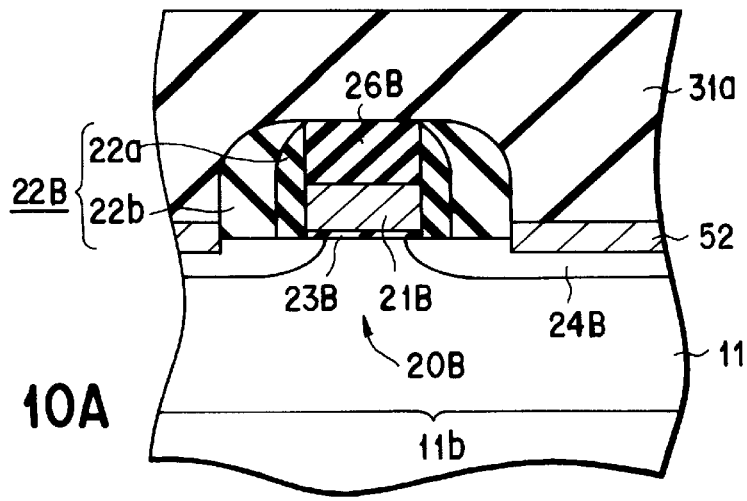
FIGS. 10A to 10C are cross-sectional views showing an example of the major part of a MOSFET of a peripheral circuit section of the DRAM of the fifth embodiment.
Figure 10B:
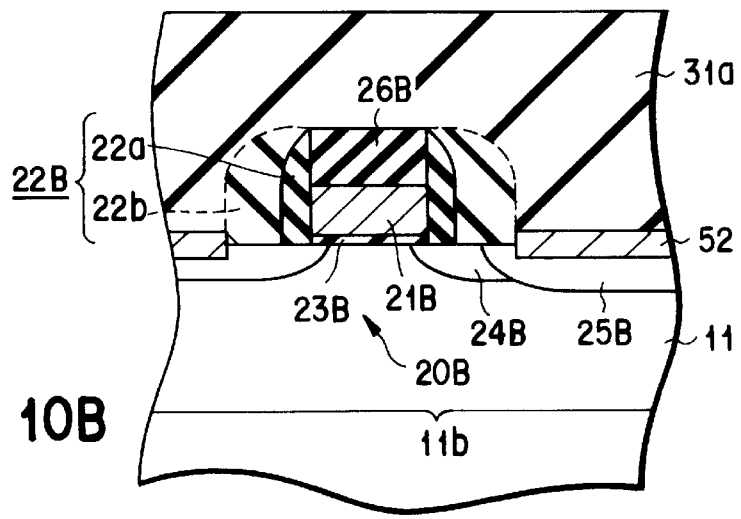
Figure 10C:
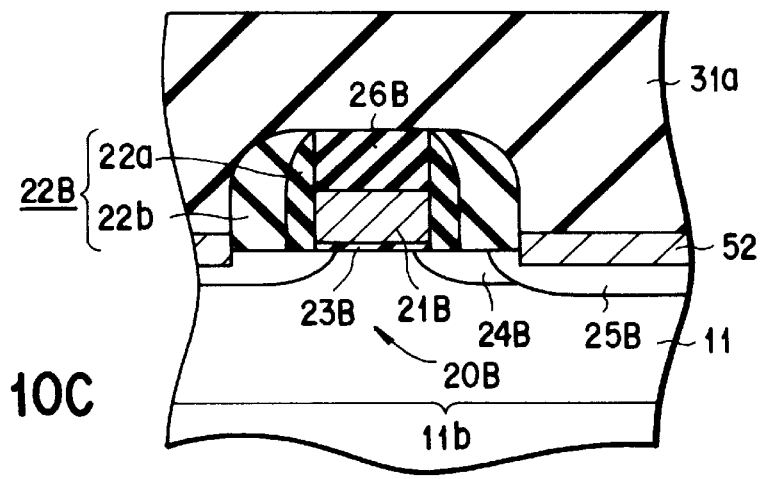

FIGS. 10A to 10C illustrate an example of the MOSFET 20B in which the gate side-wall 22B is formed on the side-wall portion of the gate electrode 21B by the side-wall insulation films 22a and 22b.

The first interlayer insulation film 31a can be formed by the same material as that of the side-wall insulation film 22b and, as illustrated in FIG. 10A, it can be formed by the material different from that of the film 22b.

In the MOSFET 20B used in the peripheral circuit section, the first interlayer insulation film 31a can be formed using a material which is the same or different from that of the side-wall insulation film 22b, and an impurity diffusion region 25B having a deeper junction than that of the source/drain region 24B can be partly formed in the region 24B to achieve an extension structure. In the example of FIG. 10B, the first interlayer insulation film 31a is formed by the same material as that of the side-wall insulation film. In that of FIG. 10C, the first interlayer insulation film 31a is formed by the different material.

Figure 11A:
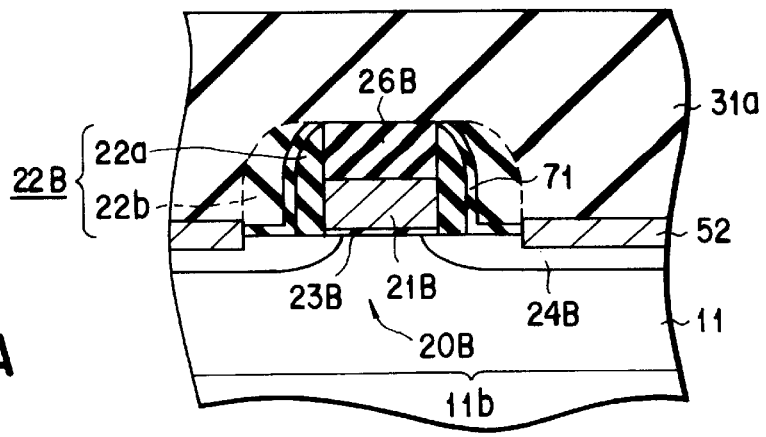
FIGS. 11A to 11D are cross-sectional views showing another example of the major part of a MOSFET of a peripheral circuit section of the DRAM of the fifth. embodiment of the present invention.

FIGS. 11A to 11D illustrate an example of the MOSFET 20B wherein a thin nitride film 71 is provided between side-wall insulation films 22a and 22b of a gate side-wall 22B formed on the side-wall portion of a gate electrode 21B. In this example, the first interlayer insulation film 31a can be formed by the same material as that of the side-wall insulation film 22b, as illustrated in FIG. 11A.

Figure 11B:
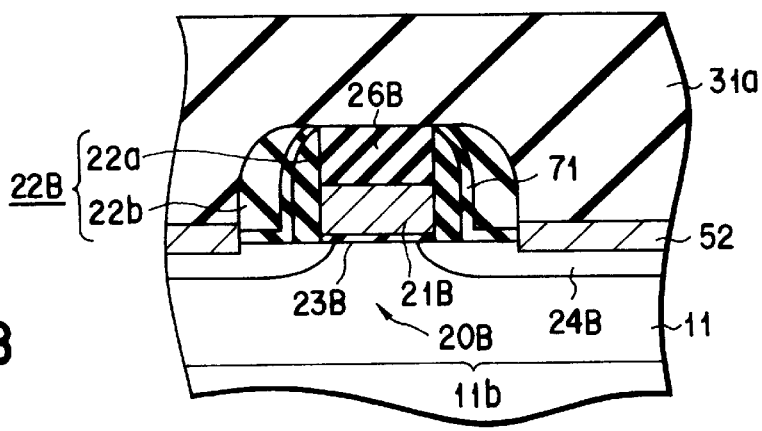
Figure 11C:
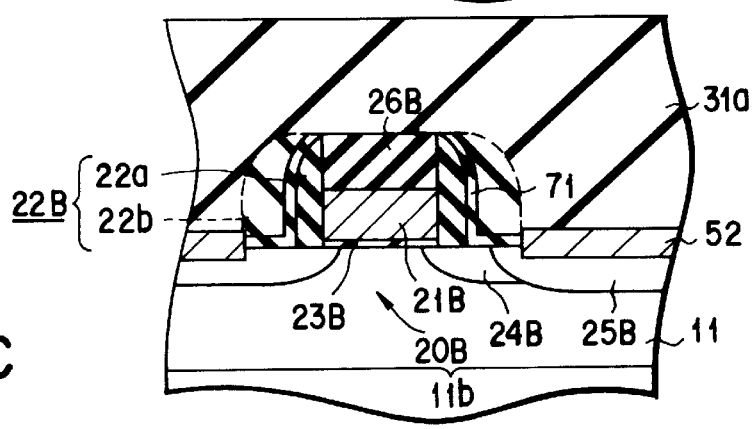
Figure 11D:
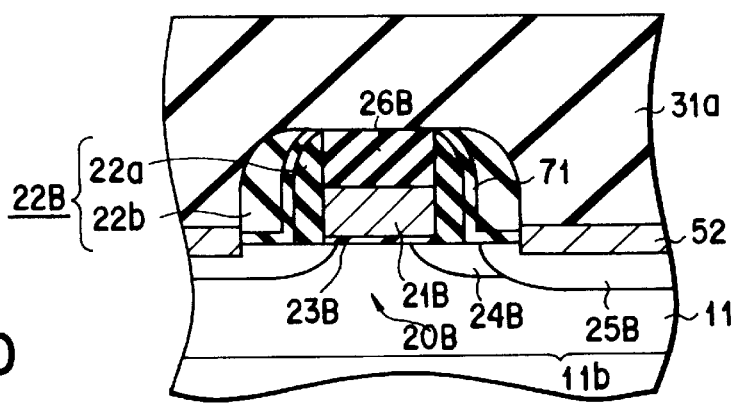

In the MOSFET 20B used in the peripheral circuit section, as shown in FIG. 11B, the first interlayer insulation film 31a and side-wall insulation film 22b can be constituted by different materials, and an impurity diffusion region 25B having a junction which is deeper than that of the source/drain region 24B is formed partly in the source/drain region 24B thereby to achieve an extension structure. FIG. 11C shows an example in which the first interlayer insulation film 31a is formed using the same material as that of the side-wall insulation film 22b to achieve an extension structure, and FIG. 11D illustrates an example in which the film 31a is formed using a material different from that of the film 22b.

Figure 12:
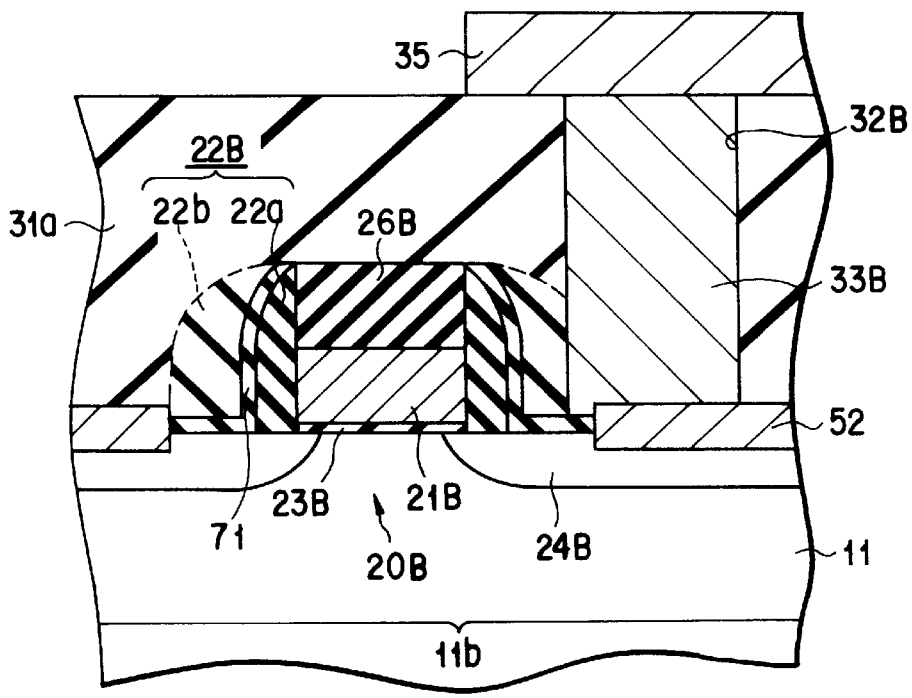
FIG. 12 is a cross-sectional view illustrating an example of the major part of the peripheral circuit section of the DRAM of the fifth embodiment of the present invention.

In the case where a silicon nitride film 71 is provided between the side-wall insulation films 22a and 22b, as shown in FIG. 12, even though the position of the hole 32B is slightly moved due to a shift in mask alignment when a contact hole 32B is formed, the film 71 extends to a silicide layer 52; therefore, an etching damage can be prevented from being caused to a semiconductor substrate 11. This is true of not only the case where the first interlayer insulation film 31a and side-wall insulation film 22b are formed by the same material, but also the case where they are formed by different materials or the extension structure is achieved.

FIGS. 13A to 13D illustrate an example of the MOSFET 20B wherein a silicon nitride film 22a' for forming a side-wall insulation film 22a of a gate side-wall 22B formed on a side-wall portion of a gate electrode 21B, is provided to extend to a silicide layer 52.

Figure 13A:
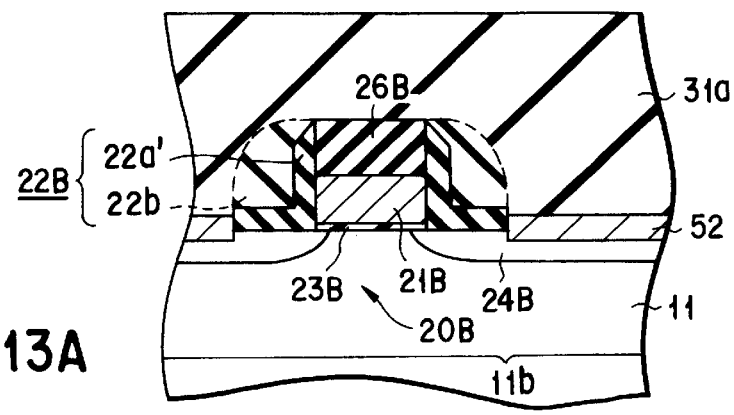
FIGS. 13A to 13D are cross-sectional views showing still another example of the major part of a MOSFET of a peripheral circuit section of the DRAM of the fifth embodiment of the present invention.

The silicon nitride film 22a' can easily be obtained by omitting an etching-back step for forming, e.g., the side-wall insulation film 22a. In this case, as illustrated in FIG. 13A, the first interlayer insulation film 31a can be formed by the same material as that of the side-wall insulation film 22b.

Figure 13B:
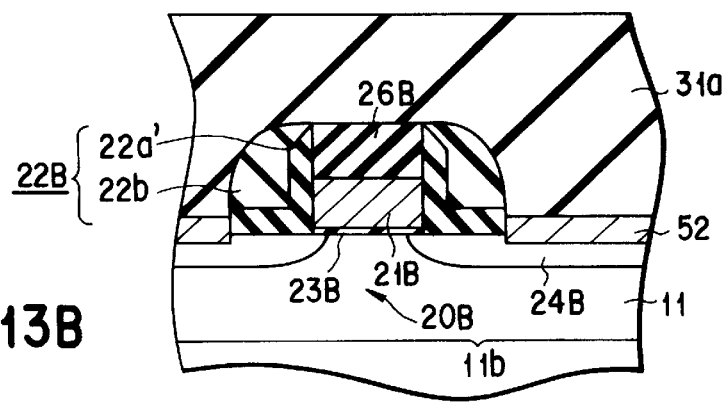
Figure 13C:
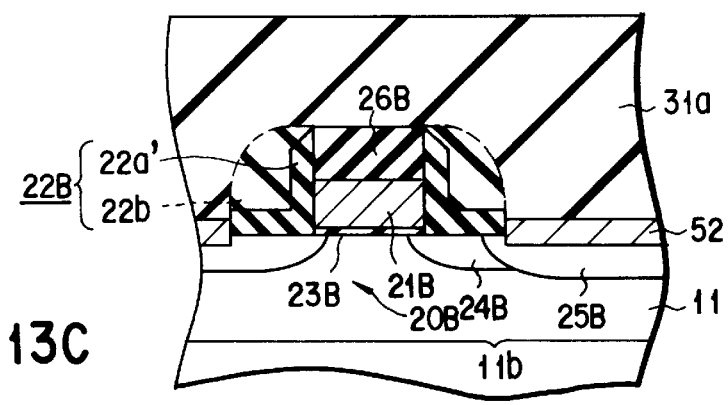
Figure 13D:
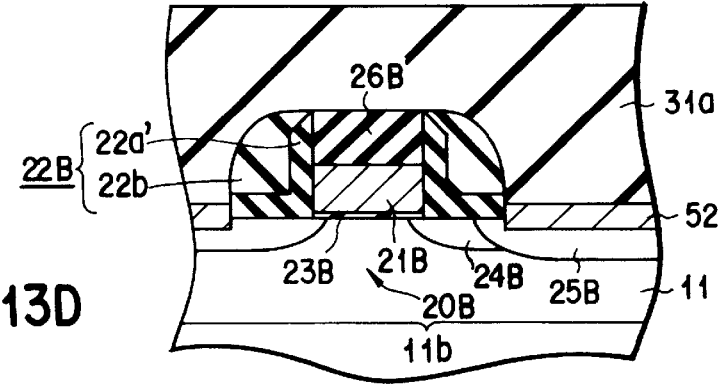

In the MOSFET 20B used in the peripheral circuit section, as shown in FIG. 13B, the first interlayer insulation film 31a and side-wall insulation film 22b can be constituted by different materials, and an impurity diffusion region 25B having a junction which is deeper than that of the source/drain region 24B is formed partly in the source/drain region 24B thereby to achieve an extension structure. FIG. 13C shows an example in which the first interlayer insulation film 31a is formed using the same material as that of the side-wall insulation film 22b to achieve an extension structure, and FIG. 13D illustrates an example in which the film 31a is formed using a material different from that of the film 22b.

Figure 14:
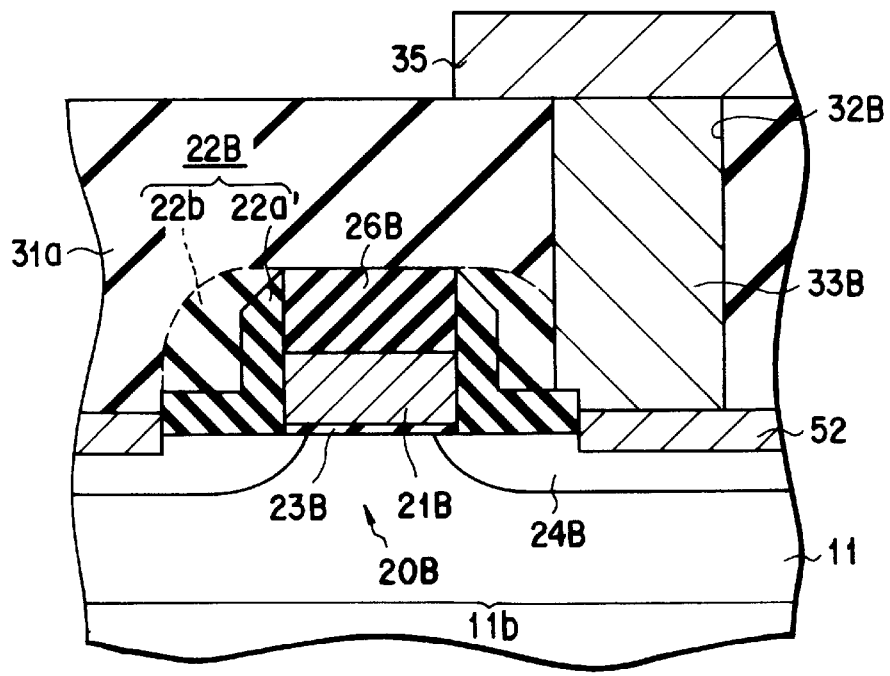
FIG. 14 is a cross-sectional view illustrating another example of the major part of the peripheral circuit section of the DRAM of the fifth embodiment of the present invention.

In the case where a silicon nitride film 22a' is provided to extend to a silicide layer 52, as shown in FIG. 14, even though the position of the hole 32B is slightly moved due to a shift in mask alignment when a contact hole 32B is formed, an etching damage can be prevented from being caused to a semiconductor substrate 11. This is true of not only the case where the first interlayer insulation film 31a and side-wall insulation film 22b are formed by the same material, but also the case where they are formed by different materials or the extension structure is achieved.

As has been described in the fifth embodiment, if the DRAM is designed to satisfy that an interval Sa between adjacent gate electrodes 21A of the memory cell section is smaller than 2(x+d) and an interval Sb between adjacent gate electrodes 21B of the peripheral circuit section is larger than 2(x+d), it is very effective in easily attaining the extension structure in the peripheral circuit section without increasing in lithographic steps, even though the DRAM is applied to the first embodiment in which the silicide layer 52 is not formed.

Needless to say, various changes and modifications can be made without departing from the scope of the subject matter of the present invention.

As has been described in detail, according to the present invention, the length of side-wall insulation film of gate electrode of MOSFET in the peripheral circuit section can be considerably increased, while that in the memory cell section is scaled down according to the scaling rule. It is thus possible to simultaneously satisfy the requirements of both a transistor which necessitates reducing the length of the side-wall insulation film in accordance with the scaling rule and a transistor which necessitates considerably decreasing the resistance of impurity diffusion layer. As a result, both a transistor which is capable of forming a fine contact hole in self-alignment with the gate electrode and a transistor which is capable of suppressing the short-channel effect and sufficiently mitigating the parasitic resistance can be integrated on the same substrate, and the DRAM can be improved in density and performance.

In particular, when a space between gate electrodes of the MOSFET in the memory cell section and that in the peripheral circuit section are defined, a patterned silicide layer and an extension region can be formed selectively on the surface of the source/drain region but not through the lithographic process.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:

forming first gate electrodes of a plurality of first transistors, which constitute a memory cell section in a memory cell region on a semiconductor substrate, and forming a second gate electrode of at least one second transistor, which constitutes a peripheral circuit section, in a peripheral circuit region on the semiconductor substrate;

depositing a first insulative material on an entire surface of the semiconductor substrate on which the first and second gate electrodes are formed;

selectively removing the first insulative material, and thereby forming a first side-wall insulation film of a first insulator on a side-wall portion of each of the first gate electrodes and forming a first insulator on a side-wall portion of the second gate electrode;

depositing a second insulative material on the exposed surface of the semiconductor substrate on which the first insulators are formed, there being a desired etching ratio between the first insulative material and the second insulative material;

selectively removing the second insulative material to leave a portion of the second insulative material between the first gate electrodes including the first insulator so as to cover the surface of the substrate between the first gate electrodes, and forming a second side-wall insulation film of the first insulator and a second insulator on the side-wall portion of the second gate electrode including the first insulator;

forming an interlayer insulation film on the entire surface of the semiconductor substrate after the second side-wall insulation film is formed, there being a desired etching ratio between the interlayer insulation film and the first insulative material; and selectively removing the interlayer insulation film and the second insulative material to form a contact hole in self-alignment with each of the first gate electrodes, the contact hole reaching the surface of the semiconductor substrate.

2. The method according to claim 1, wherein the first insulator and the second insulator are formed of materials having an etching rate difference.

3. The method according to claim 2, wherein the first insulator is formed of silicon nitride and the second insulator is formed of silicon oxide.

4. The method according to claim 1, wherein said second insulative material selective removing step leaves the second side-wall insulation film on the second gate electrode larger than the first side-wall insulation film on each of the first gate electrodes.

5. A method of manufacturing a semiconductor device, comprising the steps of:

forming a field region by which an element region is divided into a memory cell region and a peripheral circuit region;

forming first gate electrodes of a plurality of first transistors, which constitute a memory cell section, in the memory cell region, and forming a second gate electrode of at least one second transistor, which constitutes a peripheral circuit section, in the peripheral circuit region;

depositing a first insulative material on an entire surface of the semiconductor substrate;

selectively removing the first insulative material, and thereby forming a first side-wall insulation film of a first insulator on a side-wall portion of each of the first gate electrodes and forming a first insulator on a side-wall portion of the second gate electrode;

depositing a second insulative material on the exposed surface of the semiconductor substrate on which the first insulators are formed, there being a desired etching ratio between the first insulative material and the second insulative material;

selectively removing the second insulative material to leave a portion of the second insulative material between the first gate electrodes including the first insulator so as to cover the surface of the substrate between the first gate electrodes, and forming a second side-wall insulation film of the first insulator and a second insulator on the side-wall portion of the second gate electrode including the first insulator;

forming an interlayer insulation film on the entire surface of the semiconductor substrate after the second side-wall insulation film is formed, there being a desired etching ratio between the interlayer insulation film and the first insulative material; and selectively removing the interlayer insulation film and the second insulative material to form a contact hole in self-alignment with each of the first gate electrodes, the contact hole reaching the surface of the semiconductor substrate.

6. The method according to claim 5, wherein the first insulative material and the second insulative material are formed of materials having an etching rate difference.

7. The method according to claim 6, wherein the first insulative material is formed of silicon nitride and the second insulative material is formed of silicon oxide.

8. The method according to claim 5, wherein the plurality of first transistors include an outermost transistor having an electrically isolated dummy gate electrode pattern.

9. The method according to claim 5, further comprising the step of forming a contact hole through the interlayer insulation film and the second insulative material so as to be self-aligned with at least one of the first gate electrodes of the plurality of first transistors.

10. The method according to claim 9, further comprising the step of filling the contact hole with a conductive material.

11. The method according to claim 5, further comprising the step of forming a second diffusion region in the second transistor using the second side-wall insulation film as a mask.

12. The method according to claim 11, further comprising the step of forming a low-resistance region on a surface of the second diffusion region of the second transistor.

13. The method according to claim 10, further comprising the step of forming a low-resistance region on a surface of a diffusion region of the second transistor and at the same time forming a low-resistance region on a surface of the conductive material with which the contact hole is filled.

14. The method according to claim 5, further comprising the steps of:

depositing an interlayer insulation film above an entire surface of the semiconductor substrate after the second side-wall insulation film is formed; and forming a plurality of contact holes selectively in the interlayer insulation film.

15. The method according to claim 14, wherein the interlayer insulation film is formed of a material, there being an etching rate difference between the material and the first insulator.

16. The method according to claim 14, wherein at least one of the contact holes is self-aligned with the first gate electrodes of the plurality of first transistors.

17. The method according to claim 14, further comprising the step of forming a first diffusion region in each of the plurality of first transistors through the contact hole.

18. The method according to claim 17, further comprising the steps of:

forming diffusion regions for said first transistors and said second transistors, wherein the first diffusion region of each of the plurality of first transistors has a junction depth which is shallower than that of a second diffusion region of the second transistors.

19. The method according to claim 5, further comprising the step of depositing a third insulative material after the first side-wall insulation film is formed.

20. The method according to claim 19, wherein the third insulative material is formed of a material, there being an etching rate difference between the material and the second insulative material.

21. The method according to claim 19, wherein the third insulative material is thinner than the first insulative material.

22. The method according to claim 5, wherein said insulative material selective removing step leaves the second side-wall insulation film on the second gate electrode larger than the first side-wall insulation film on each of the first gate electrodes.

23. A method of manufacturing a semiconductor device, comprising the steps of:

forming first gate electrodes of a plurality of first transistors, which constitute a memory cell section, in a memory cell region on a semiconductor substrate and forming a second gate electrode of at least one second transistor, which constitutes a peripheral circuit section, in a peripheral circuit region on the semiconductor substrate;

depositing a first insulative material above an entire surface of the semiconductor substrate;

selectively removing the first insulative material to form a first insulator on each of side-portions of the first gate electrodes and the second gate electrode;

depositing a second insulative material on the exposed surface of the semiconductor substrate on which the first insulators are formed, there being a desired etching ratio between the first insulative material and the second insulative material;

selectively removing the second insulative material to leave a portion of the second insulative material between the first gate electrodes including the first insulator so as to cover the surface of the substrate between the first gate electrodes, and forming a second side-wall insulation film of the first insulator and a second insulator on the side-wall portion of the second gate electrode including the first insulator;

forming an interlayer insulation film on the entire surface of the semiconductor substrate after the second side-wall insulation film is formed, there being a desired etching ratio between the interlayer insulation film and the first insulative material; and selectively removing the interlayer insulation film and the second insulative material to form a contact hole in self-alignment with each of the first gate electrodes, the contact hole reaching the surface of the semiconductor substrate.

24. The method according to claim 23, further comprising the step of forming a low-resistance region in a surface portion of the semiconductor substrate in the second transistor from which the second insulative material is removed.

25. The method according to claim 23, wherein the first insulative material and the second insulative material are formed of materials having an etching rate difference.

26. The method according to claim 25, wherein the first insulative material is formed of silicon nitride and the second insulative material is formed of silicon oxide.

27. The method according to claim 23, further comprising the step of depositing a third insulative material after the first insulator is formed.

28. The method according to claim 27, wherein the third insulative material is formed of a material, there being an etching rate difference between the material and the second insulative material.

29. The method according to claim 23, wherein said second insulative material selective removing step leaves the second side-wall insulation film on the second gate electrode larger than the first side-wall insulation film on each of the first gate electrodes.

* * * * *